United States Patent [19]

Bull

[11] Patent Number: 5,655,107

[45] Date of Patent: Aug. 5, 1997

[54] DIGITAL LOGIC WIRE DELAY SIMULATION

[75] Inventor: Michael Bull, Morgan Hill, Calif.

[73] Assignee: International Business Machines Corporation, Armonk, N.Y.

[21] Appl. No.: 347,006

[22] Filed: Nov. 30, 1994

[51] Int. Cl.⁶ .................................................. G06F 9/455
[52] U.S. Cl. ............................................. 395/500; 364/488
[58] Field of Search .................................... 364/488, 489, 364/490, 491, 578; 395/500, 141; 345/22

[56] References Cited

U.S. PATENT DOCUMENTS

| | | | |
|---|---|---|---|
| 4,924,430 | 5/1990 | Zasio et al. | 364/578 |
| 5,572,437 | 11/1996 | Rostoker et al. | 364/489 |

*Primary Examiner*—Kevin J. Teska
*Assistant Examiner*—Matthew Loppnow
*Attorney, Agent, or Firm*—Baker, Maxham, Jester & Meador

[57] ABSTRACT

A digital logic simulation system simulates a digital logic system having component blocks connected by nets with a master queue that contains events to be performed during the simulation, a scheduler that adds events to the master queue such that the processing of each block is represented by an update event and a compute event, and a dispatcher that maintains a time clock that defines a simulation clock time, extracts events from the master queue according to the simulation clock time, and produces a simulation output, such that wire delays for particular nets are modelled with a corresponding update event and compute event. Only those nets that have an associated wire delay that is being modelled will cause a wire delay update event and compute event. All other nets will not result in wire delay events.

19 Claims, 18 Drawing Sheets

440 →

| SINGLE/<br>MULTI-<br>SOURCE<br>FLAG | MULTI-<br>SOURCE<br>VALUE<br>LIST<br>POINTER | EVENT<br>TYPE | NET<br>TABLE<br>POINTER | RISING/<br>FALLING<br>DELAY<br>PAIR<br>FOR<br>SOURCE |
|---|---|---|---|---|

*FIG. 18*

DIGITAL LOGIC WIRE DELAY SIMULATION

BACKGROUND OF THE INVENTION

1. Field of the Invention

This invention relates generally to simulation of digital logic systems and, more particularly, to the processing of wire delay values for nets within digital logic systems that are being simulated.

2. Description of the Related Art

Digital logic simulation refers to computer-aided design of complicated logic networks in which a software model of a logic network is supported so that a set of inputs can be provided to the software model and the output of the model can be obtained to confirm the desired operation. In addition, many digital logic simulation systems permit the performance of the logic network to be studied. That is, the time needed for a signal to propagate through the logic network can be simulated and evaluated. Most digital logic simulation systems are designed to operate in a host mainframe computer system or workstation environment.

The logic network being simulated comprises a digital logic circuit whose components are modelled as blocks that receive input logic data values from one or more input pins and produce output values based on the input, and provide the output values to one or more output pins. Blocks can represent latched components that operate in accordance with a clock signal, such as multiplexers and flip-flops, or blocks can represent combinational logic elements, such as AND gates and OR gates, or the blocks can represent operational circuits, such as processor units and arithmetic logic units. Just as the digital logic circuit components are connected to each other by wires, the simulation blocks of the software model are "connected" to other blocks by nets.

Some logic simulation systems permit the modelling of delay times through logic circuit components, wherein the model considers a delay time comprising the time necessary for an input value to propagate through a circuit component. In the design of relatively complex digital systems that operate at high digital signal frequencies, it can be important to consider delay times due to the time necessary for a logic value to propagate over a wire connecting one component to another. The propagation time can vary dramatically because the length of a connecting wire can vary dramatically. For example, the length of a connection between two components located on the same circuit chip can be on the order of microns, while the length of a connection extending between two different chips can be on the order of millimeters, which is equal to thousands of microns. The logic value propagation times can vary accordingly and can become significant at high signal frequencies.

The performance of logic simulation systems can vary greatly in terms of processing time, data requirements, computer hardware support requirements, and the like. In the case of logic simulation systems that support modelling of wire delays, simulation performance and capabilities can vary greatly. For example, some systems permit only wire delay values of a fixed duration. As noted above, wire delays for connections can vary greatly. Modelling wire delays with fixed duration delay times can result in inaccurate simulation performance. Alternatively, such systems might need to model variable wire delays with multiple nets connected serially. The performance penalty for modelling a string of wire delay nets can be severe.

In addition to variations in the fidelity of wire delay modelling, performance also can be greatly reduced when wire delays are being modelled. That is, some logic simulation systems incur a significant increase in execution time when wire delays are modelled as compared to execution time without wire delays. For example, a digital logic circuit being modelled can include hundreds of thousands of components. The simulation blocks would be correspondingly connected by hundreds of thousands of nets, potentially requiring the specification of thousands of wire delay values that must be considered during the simulation. Such additional processing as compared with systems that do not model wire delays can comprise a significant performance penalty.

From the discussion above, it should be apparent that there is a need for a logic simulation system that supports wire delays that accurately reflect values of the logic circuit being modelled without incurring a significant performance penalty. The present invention satisfies this need.

SUMMARY OF THE INVENTION

A digital logic simulation system constructed in accordance with the present invention simulates a digital logic system having component blocks connected by nets with a master queue that contains events to be performed during the simulation, a scheduler that adds events to the master queue such that the processing of each block is represented by an update event and a compute event, and a dispatcher that maintains a time clock that defines a simulation clock time, extracts events from the master queue according to the simulation clock time, and produces a simulation output, such that wire delays for particular nets are modelled with a corresponding update event and compute event. Thus, only those nets that have an associated wire delay that is being modelled will cause a wire delay update event and compute event. All other nets will not result in wire delay events. In this way, nets that are not being modelled with a wire delay value will incur no processing penalty, and the nets that are being modelled with a wire delay can have their associated wire delay values precisely modelled by proper specification of the corresponding compute event. In either case, the processing path of the scheduler is not changed depending on whether a wire delay is being modelled or is not being modelled.

In particular, each type of update event determines the type of compute event processing to be carried out and each type of compute event determines the particular output value and simulation clock time at which the output value is produced. The variety of update processing supported by the system determines the complexity of digital logic systems that can be simulated. In one aspect of the invention, nets having multiple sources and multiple sinks are supported with corresponding update processing. Similarly, compute processing is provided for logic blocks and for wire delay nets.

Other features and advantages of the present invention should be apparent from the following description of the preferred embodiment, which illustrates, by way of example, the principles of the invention.

BRIEF DESCRIPTION OF THE DRAWINGS

FIG. 18 is a representation of the wire delay table data structure accessed during the processing illustrated in FIG. 14.

DESCRIPTION OF THE PREFERRED EMBODIMENT

Figure 1:
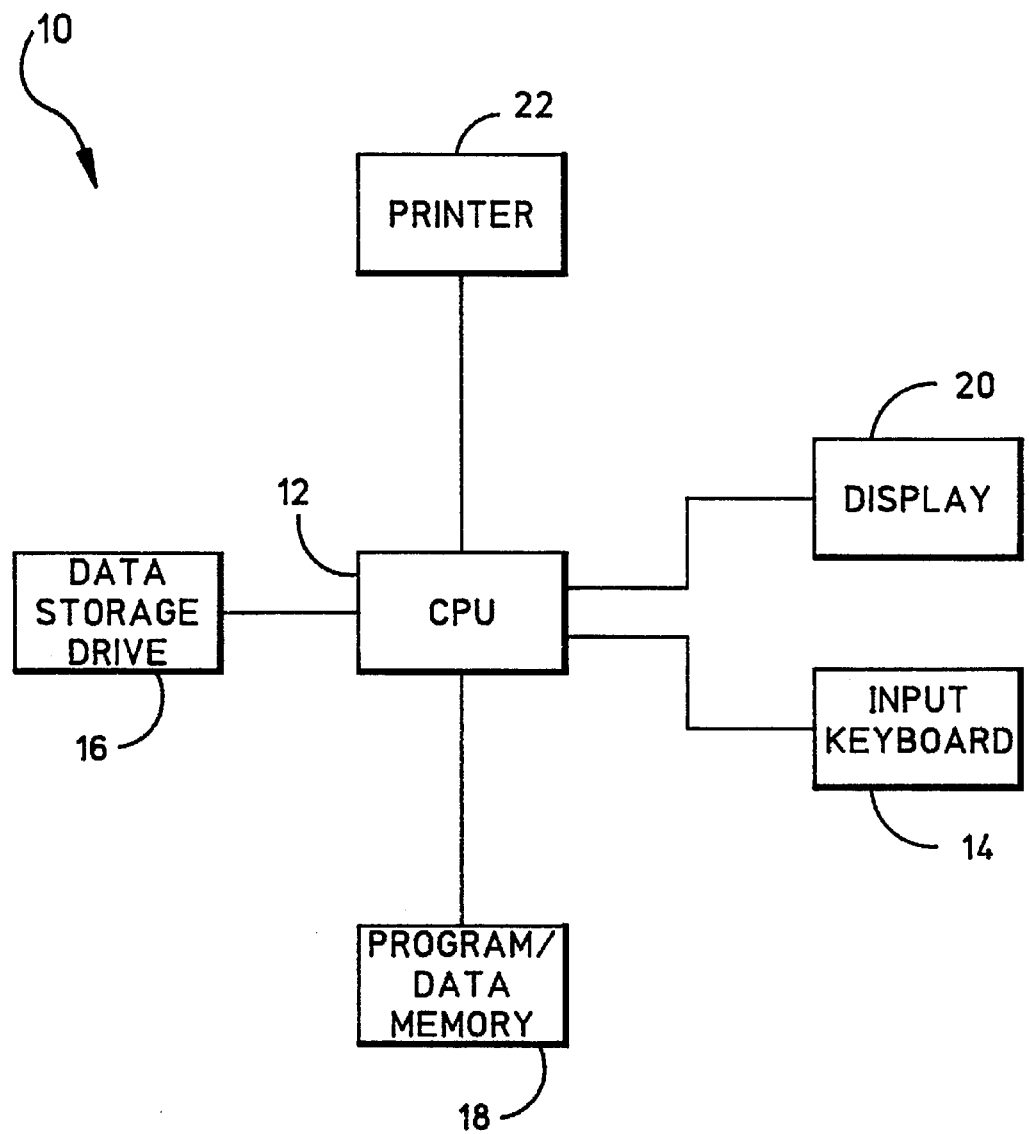
FIG. 1 is a block diagram of a computer system constructed in accordance with the present invention.
Figure 2:
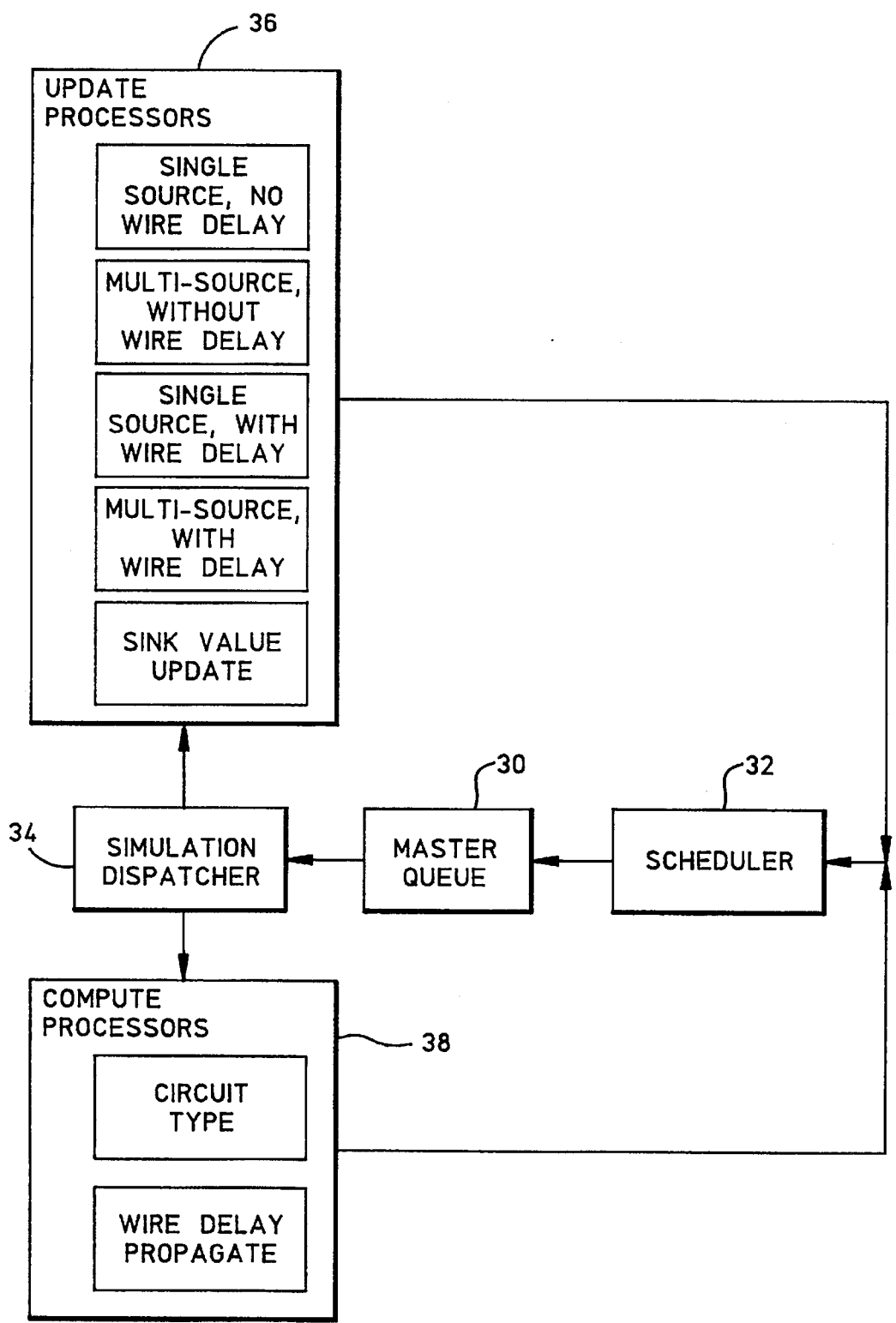
FIG. 2 is a block diagram of the logic simulation system illustrated in FIG. 1.

FIG. 1 illustrates a computer system 10 constructed in accordance with the present invention, in which a central processing unit (CPU) 12 receives interactive commands from a system user via an input keyboard 14. The CPU also receives data from a data storage drive 16 and a program/data memory 18. System output is communicated to the user through a display 20 and/or a hard copy printer 22. FIG. 2 is a block diagram of the simulation system, which resides in the program/data memory. The system includes a master queue 30 that contains events to be performed during the simulation and a scheduler 32 that adds events to the master queue. The simulation system also includes a dispatcher 34 that maintains the simulation time clock, extracts events from the master queue, passes simulation control to appropriate processors, and produces the simulation output. Update processors 36 and circuit compute processors 38 receive update events and compute events, respectively, from the dispatcher, perform their respective functions, and provide their output to the scheduler. In accordance with the invention, the scheduler will cause a wire delay update event and compute event in the master queue only for those particular nets that are being modelled with wire delay values. All other nets will not result in wire delay events. This reduces the processing load for the overall logic circuit being simulated and simplifies the processing of the scheduler.

In particular, the simulation system update processing supports a number of different net update processing functions, including processing for single source, without wire delay net updates, multi-source, without wire delay net updates, single source, with wire delay net updates, multi-source, with wire delay net updates, and wire delay sink value updates. Similarly, the system compute processing supports a number of compute processing functions, including a circuit-type compute function and a wire delay propagation compute function. A different processor can be provided for each of these functions or, as described further below, the same processor can implement more than one of the supported functions, in accordance with the data structures of the preferred embodiment.

The simulation system preferably comprises software program steps that can be supported and executed, for example, on a computer mainframe processor system such as the "System 370" by International Business Machines ("IBM") Corporation, on an "RS 6000" workstation by IBM Corporation, or by similar machines, workstations, and processors provided by other manufacturers. The simulation system can be embodied in a program storage device, such as a floppy disk readable by the data storage drive 16, on which the program steps are stored for execution by the CPU 12. The program steps can be provided in a variety of computer languages, including, but not limited to, "C" and "PL/X". The output display device 20 can comprise a conventional video display terminal having a display screen. The program/data memory 18 typically comprises the random access memory associated with a conventional CPU 12, such as are typically provided with the processors described above.

Figure 3:
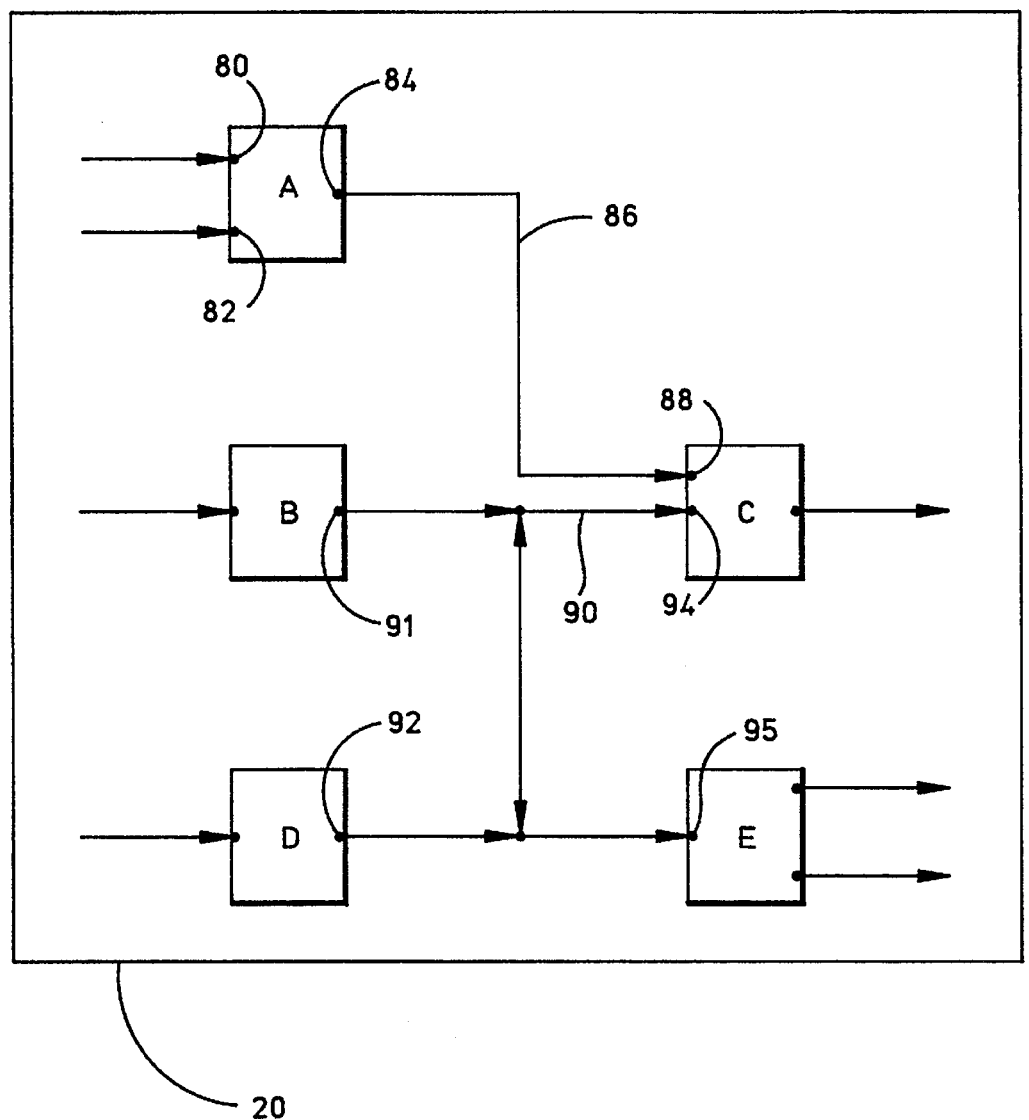
FIG. 3 is a representation of a logic system whose processing can be simulated by the logic simulation system illustrated in FIGS. 1 and 2.

In the preferred embodiment, a user can access the simulation system illustrated in FIGS. 1 and 2 via the input keyboard 14 and provide data necessary to define a logic circuit whose operation will be simulated. The user can provide the data via a combination of interactive input through the input keyboard and data previously stored on a disk that can be read by the data storage drive 16. FIG. 3 represents the view the user would see on the display device 20 (or alternatively read from the output of the printer 22) after providing the data and requesting a view of the simulation circuit. The logic circuit illustrated in FIG. 3 includes five logic blocks designated A, B, C, D, and E. As noted above, the logic blocks can represent either individual components such as AND, NOR, and OR gates and the like, or can represent more complicated blocks such as processors, multiplexers, and memory registers, or can represent entire logic circuits containing multiple devices including processors, memory blocks, and the like.

As noted above, logic signal flow paths between the blocks are referred to as nets and each connection point between a block and a net is referred to as a pin. The direction of information flow through the logic circuit is represented by arrowheads on the ends of the nets. Block connections at the beginning of a net are referred to as sources and block connections at the end of a net are referred to as sinks. Thus, in FIG. 3, the block designated A is a sink for two nets, whose signals are received at respective connection pins 80, 82. The A block has a single output pin 84. The A block is connected to the C block via a net 86. The A block output is received at a first input pin 88 of the C block. The net 86 is referred to as a single source net because of the single connection pin 84 at the source end from the A block. The net 86 has a single sink, which is connected to the C block at the pin 88.

The simulation system also supports modelling of nets that comprise multiple source, multiple sink nets. The net 90 illustrated in FIG. 3 is an example of such a net. The net 90 connects the B block and D block to the C block and E block. Inspection of the net shows that it has a first source input connection from the B block at a pin 91 and a second source input connection from the D block at a pin 92. Therefore, this net 90 is a multiple source net. Further inspection shows the net provides a logic signal to the C block at a pin 94 and also provides a logic signal to the E block at a pin 95. Therefore, this net 90 also is a multiple sink net. It should be apparent that a net can comprise a combination of such characteristics, such as being a single source, multiple sink net or a multiple source, single sink net. Moreover, it should be clear that a block (such as any one of the blocks A, B, C, D, and E) can have virtually any number of source pins and sink pins.

It should be noted that each of the different net input sources from the B block and from the D block can have different values at their respective pins 91, 92. Those skilled in the art will appreciate that predetermined combinational rules will define how the two input signals from the B block and the D block will be combined to produce the input signals to the C block and E block. For example, the signal from the net 90 to the C and E blocks might comprise the logical sum of the two input signals from the B and D blocks. Alternatively, the combined signal might comprise the logical product of the two B and D input signals. If desired, the combinational rule for multiple source nets can be a user-defined function. In any case, the predetermined combinational rules are defined at initialization of the simulation system, when other data structures also are defined. This is described in greater detail below.

The system illustrated in FIGS. 1 and 2 supports simulation with and without wire delay values for each of the nets in the logic system being modelled. Thus, the wire delay values for any of the nets 86, 90 illustrated in FIG. 3 can be completely ignored, in which case no simulation processing time whatsoever is spent on wire delay computations. Alternatively, wire delay events can be defined for any one or combination of more than one of the FIG. 3 nets. This can be accomplished, in accordance with the preferred embodiment, because the system schedules an update event for each circuit block A, B, C, D, E and so forth to occur whenever the output value of the block is to change, and also schedules a net update event for each block output change. The system advantageously makes use of the net update event to permit a user to specify whether the net will be updated with or without considering wire delay. The user specifies the net wire delay rules, as well as the connections and block processing, at the time of logic circuit definition and initialization.

That is, if a user wishes to consider the wire delay of a net in the simulation, then in the initialization data the user defines a wire delay update event for that net. The scheduler of the system places a wire propagate update event on the master queue to occur at the appropriate simulation time. The dispatcher retrieves the update event when the simulation clock time matches the corresponding master queue time and directs the appropriate compute processor to calculate the new net value (the logic value at the end of the net connected to a circuit block) and to place that new value as an update event at the appropriate simulation clock time in the future.

In this way, nets whose wire delay values are being considered are processed just as another circuit block. The additional processing therefore is minimal, because no special processing sequence is required for the dispatcher or scheduler. Nets whose wire delay values are not being considered do not add any additional processing time at all. Thus, a simulation system constructed in accordance with the present invention can efficiently model wire delays without significant processing penalty as compared with the system simulation without wire delay.

Figure 4:
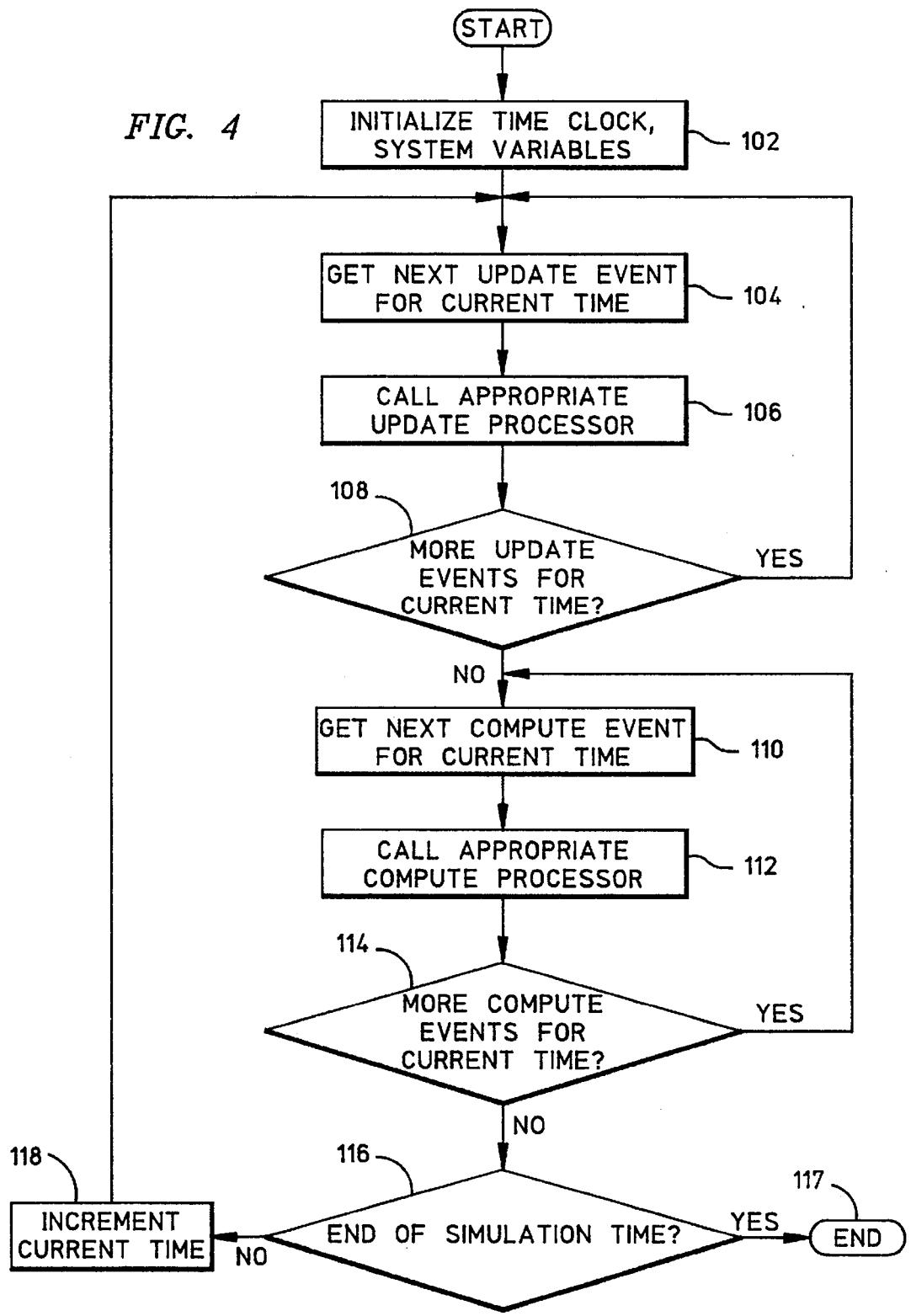
FIG. 4 is a flow diagram that illustrates the processing steps performed by the simulation Dispatcher of FIG. 2.

The processing of the simulation dispatcher 34 will be better understood with reference to the flow diagram of FIG. 4. The first processing step performed by the simulation dispatcher is to initialize the simulation time clock and associated simulation system variables, as represented by the first flow diagram box 102 in FIG. 4. Initialization includes the specification of the blocks of the system being simulated and the nets connecting them, as well as the processing to be carried out for each block and net. In the next step, the dispatcher obtains the next update event from the master queue for the current simulation time clock value, as represented by the flow diagram box numbered 104. The data comprising the master queue typically is stored in the program/data memory 18 illustrated in FIG. 1. A simulation system user can initiate a series of input changes by interactively defining an initial update event comprising an input value change. Alternatively, a user might specify a sequence of input changes, or might specify a single initial input signal value, in a memory location or in the data storage drive 16 (FIG. 1) and then direct the simulation dispatcher to obtain the first update event at that specified location. This initial update event starts the simulation, which propagates the signal throughout the logic circuit.

After the update event is obtained from the master queue, the next step is for the dispatcher to call the appropriate update processor in accordance with the update event, as represented by the FIG. 4 flow diagram box numbered 106. Thus, a wire delay update event that is identified as a "single source, without wire delay" update event will result in a call to the processor implementing the single source, without wire delay update function. Similarly, each of the other update events supported by the system will be associated with a corresponding update processor call. Each processor is preferably implemented as a software subroutine of the simulation system, but alternatively can be implemented in firmware or hardware. As described more particularly below, an update event can result in the scheduling of a compute event. After the update event has been processed, the simulation dispatcher again examines the master queue for the present simulation time clock value to determine if more update events are present, as indicated by the flow diagram decision box numbered 108.

If there is an additional update event at the current simulation clock time, then processing returns to the flow diagram box numbered 104, where the next update event is retrieved from the master queue. If no more update events for the current time are in the master queue, a negative outcome at the decision box numbered 108, then the simulation dispatcher examines the master queue at the current time for the next compute event, as indicated by the flow diagram box numbered 110. If a compute event is retrieved, then the simulation dispatcher calls the appropriate compute processor corresponding to the compute event, as indicated by the flow diagram box numbered 112. As with the update processors, the compute processors are preferably implemented as software routines but also can be implemented as firmware or hardware. The compute processors provide the logic calculations necessary to implement, for example, logic gates such as AND, OR, and NOR gates, to implement components such as multiplexers and registers, and to implement each of the logic circuit blocks that are supported by the simulation system.

After the compute processor calculations have been performed, the simulation dispatcher checks the master queue for the current simulation clock time to determine if more compute events remain, as indicated by the decision box numbered 114. If there are more compute events, then processing returns to the flow diagram box numbered 110 to obtain the next compute event. If no more compute events are on the master queue for the current clock time, then processing proceeds to the decision box numbered 116, where the simulation dispatcher checks to determine if the simulation time interval end has been reached. If the end has been reached, then the simulation processing ends and, if desired, a final output report is produced. If the end of the simulation has not been reached, then the simulation dispatcher increments the current simulation clock time at the flow diagram box numbered 118 and processing then returns to the flow diagram box numbered 104, where the master queue is examined for the current simulation clock time.

The operation of the simulation dispatcher will be further understood with reference to the following pseudo code, which provides a text description of the processing steps illustrated in the flow diagram of FIG. 4:

```
Pseudo-code for the processing of
    the Simulation Dispatcher:
Simulation Dispatcher Processing
Initialize simulation time clock, system
        variables, and the like;
Master Queue Time Loop:
        For all times on the Master Queue
        Get the next simulation time from
            the Master Queue
Update Event Loop
        For all Update Events at the current
            simulation tim e:
        Get next Update Event from the
            Master Queue;
        Call the appropriate Update Processor
            for executing the event
            according to the type of Update
            Event:
            (1) Single Source, Without Wire
                    Delay Update Processor;
            (2) Multi-Source, Without Wire
                    Delay Update Processor;
            (3) Single Source, With Wire
                    Delay Update Processor;
            (4) Multi-Source, With Wire
                    Delay Update Processor;
                or
            (5) Wire Delay Sink Value
                    Update Processor;
        END of Update Event Loop;
Compute Event Loop
        For all Compute Events at the
            current Simulation Time:
        Get the next Compute Event from
            the Master Queue;
        Call the appropriate Compute
            Processor for executing the
            event according to the type of
            Compute Event:
            (1) Circuit Component
                    Compute Processor; or
            (2) Wire Delay Propagate
```

-continued

```
                Compute Processor;
        END of Compute Event Loop;
        END of Master Queue Time Loop;
Terminate Simulation.
```

The processing illustrated by the pseudo code should be clear in view of the description of the flow diagram of FIG. 4 without further explanation.

Figure 7:
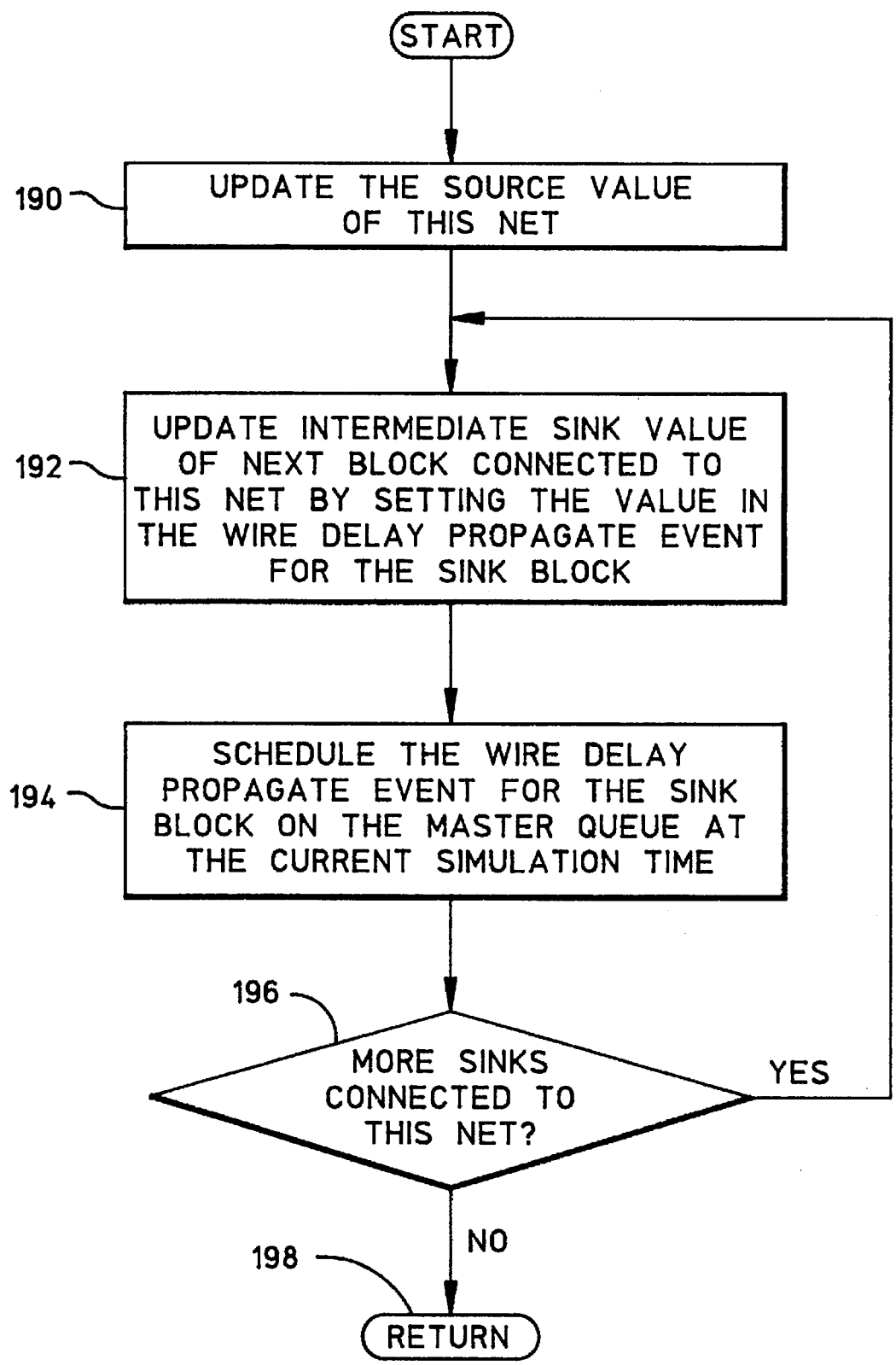
FIG. 7 is a flow diagram that illustrates the processing steps performed by the Single Source, With Wire Delay update processor of FIG. 2.
Figure 8:
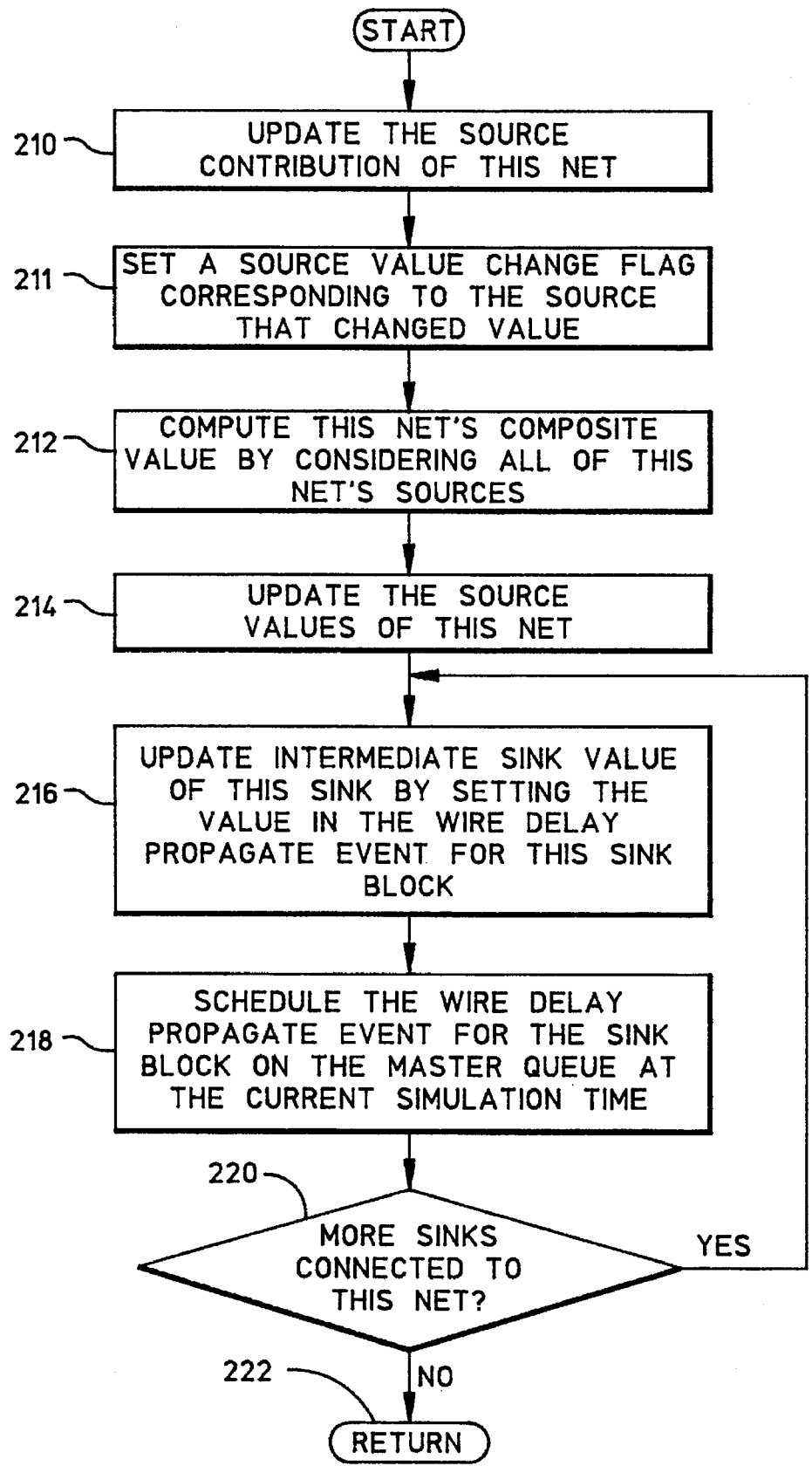
FIG. 8 is a flow diagram that illustrates the processing steps performed by the Multi-Source, With Wire Delay update processor of FIG. 2.
Figure 9:
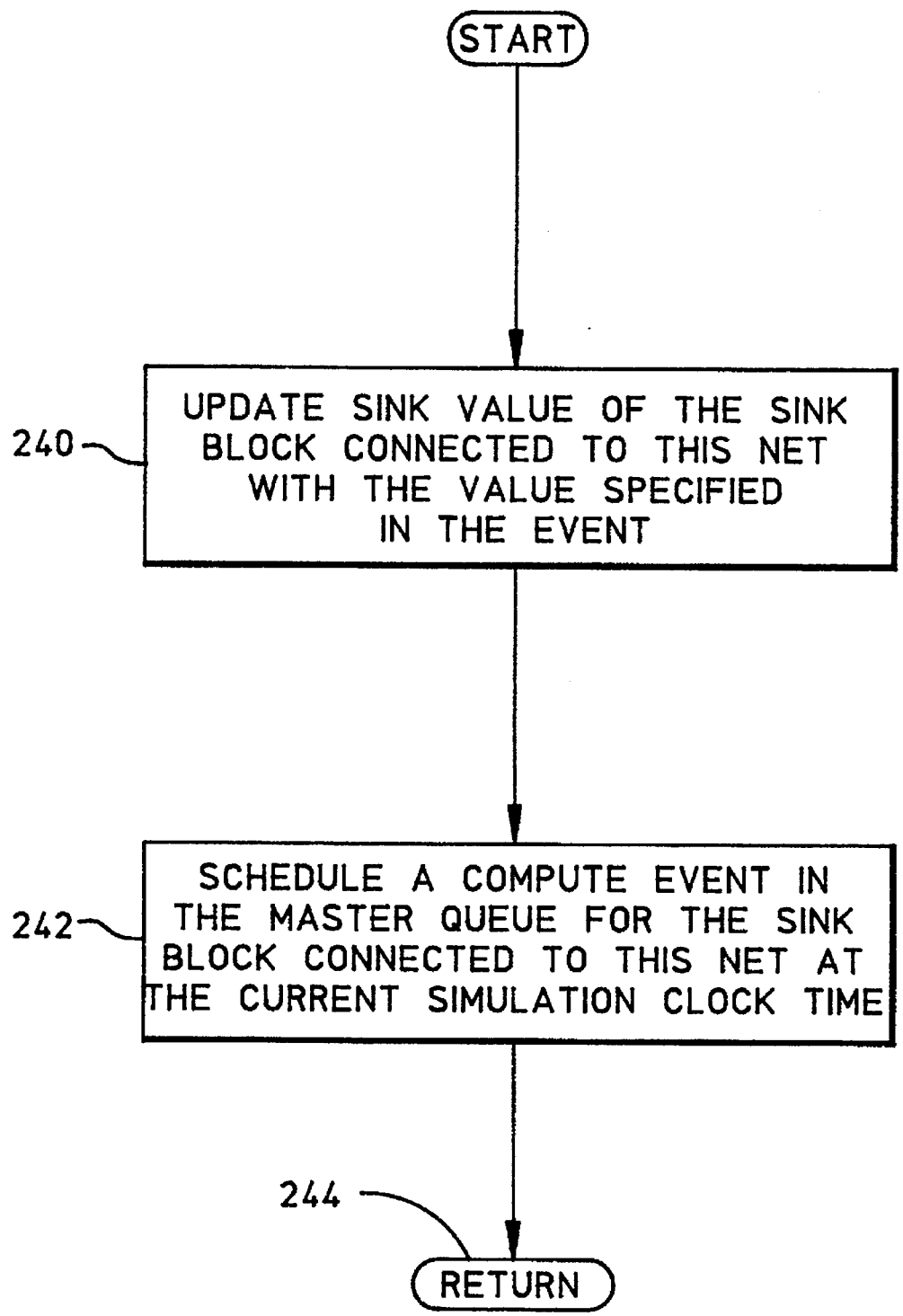
FIG. 9 is a flow diagram that illustrates the processing steps performed by the Wire Delay Sink Value update processor of FIG. 2.

The operation of the various update process functions will be better understood with reference to the respective flow diagrams of FIG. 5 through FIG. 9. In particular, FIGS. 5, 6, 7, and 8 illustrate the processing steps implemented for the various types of nets supported by the simulation system, which include nets with single sources and with multiple sources, and also nets with and without wire delay values. FIG. 9 illustrates the processing steps followed by the update processor that corresponds to a net wire delay sink value. That is, if a wire delay value is associated with a net, then the processing steps of FIG. 9 update the value at the end of the net, including the wire delay increment of simulation clock time.

Figure 5:
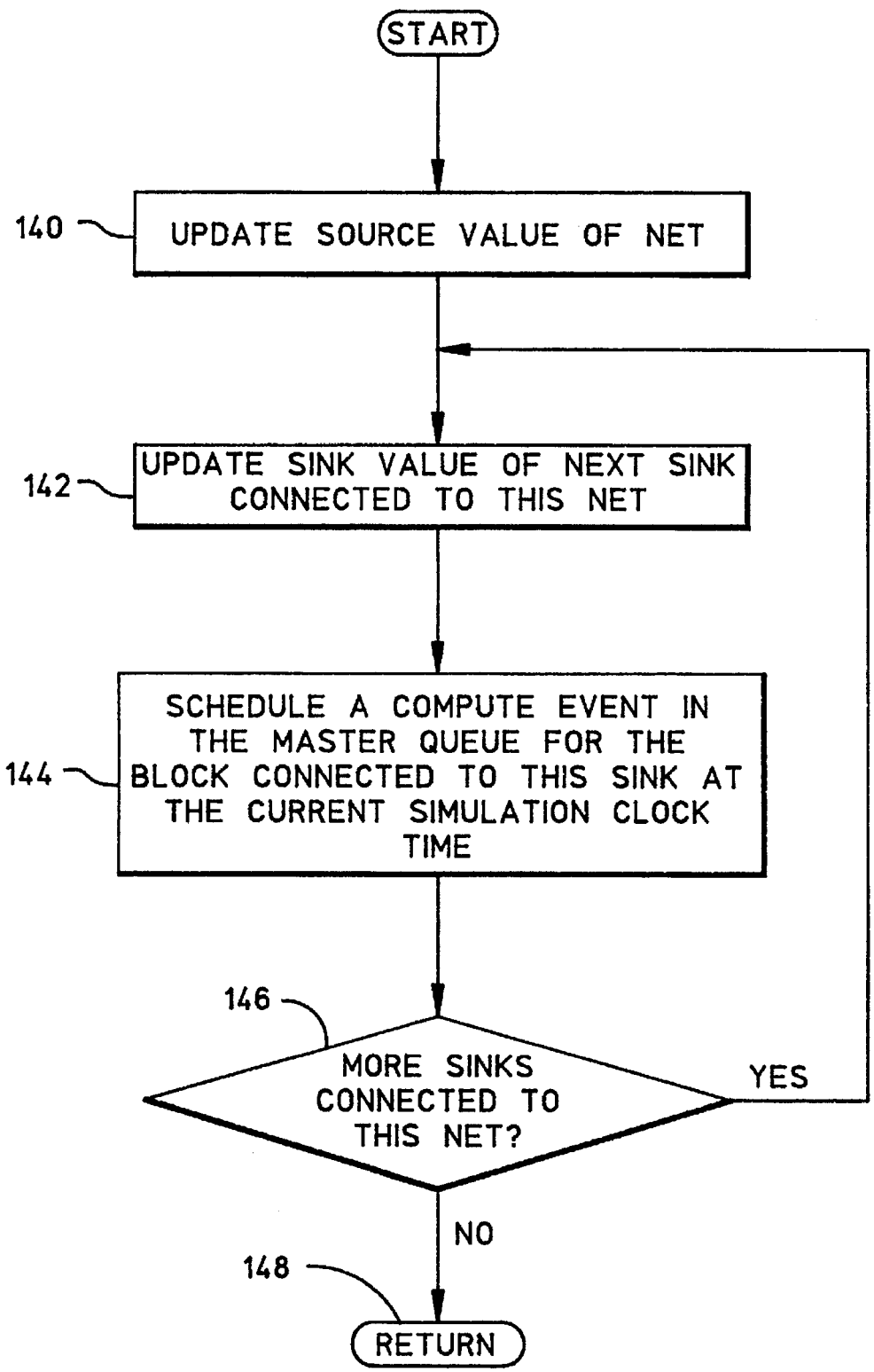
FIG. 5 is a flow diagram that illustrates the processing steps performed by the Single Source, No Wire Delay update processor of FIG. 2.

FIG. 5 illustrates the processing steps followed by the "single source, without wire delay" update processor. This processing is performed to update the value of a net when the output value of the block connected at the source (beginning) of the net is scheduled to change. The first step, represented by the flow diagram box numbered 140, is to update the source value for the net associated with this update event. That is, the furthest upstream point of this net is set equal to the value of the block pin to which it is connected. In FIG. 3, for example, the source of the net 86 is set equal to the value of the pin 84 for the source block A.

The next step in update processing is to update the sink value of the next sink block connected to this net, as represented by the FIG. 5 flow diagram box numbered 142. In this step, the value of the input pin of the sink block connected to this net is set equal to the output value of this net. Thus, no wire delay value is incorporated into the update. Relating back to FIG. 3 once again, this step involves setting the pin 88 of the sink block C to the updated value of the net 86. The next step in the update processing is to schedule a compute event in the master queue for the sink block at the current simulation clock time, represented by the flow diagram box numbered 144 in FIG. 5. In this processing step, a compute event is scheduled to occur at the current simulation clock time in which the output of the block connected to this sink will be determined. At the decision box numbered 146, the update processor checks to determine if additional sink blocks are connected to this net. If there are more sinks, then processing returns to the flow diagram box numbered 142. If no more sinks are connected to this net, then processing returns to the simulation dispatcher, as indicated by the return box numbered 148.

Thus, all of the sinks connected to the net are updated with the new net value and a compute event is scheduled on the master queue for each sink block connected to the net for the computation of a new block output value. In the case of the single source, single sink net 86 illustrated in FIG. 3, only one compute event will be scheduled, which will be the compute event associated with the pin 88 of block C.

The operation of the single source, without wire delay update process function will be further understood with reference to the following pseudo code, which provides a text description of the processing steps illustrated in FIG. 5:

```
Single Source, No Wire Delay Update
Processor--executed at the time that
the output value of the source block is
scheduled to change.
Update the source value of this Net by
        setting the output Pin value of
        the Source Block connected to
        the Net equal to the value
        specified in the event;
Sink Block Loop
        For each Sink Block connected to
                this Net:
                Update the Sink value by
                        setting the input
                        Pin value of the
                        Sink Block connected
                        to the Net equal to
                        the value specified
                        in the event;
                Schedule a Compute
                        Event on the Master
                        Queue at the current
                        Simulation Time for
                        the Sink Block
                        connected to the Net;
                END of Sink Block Loop;
Return to Dispatcher.
END.
```

The processing illustrated by the pseudo code should be clear, in view of the description of the flow diagram of FIG. 5, without further explanation.

Figure 6:
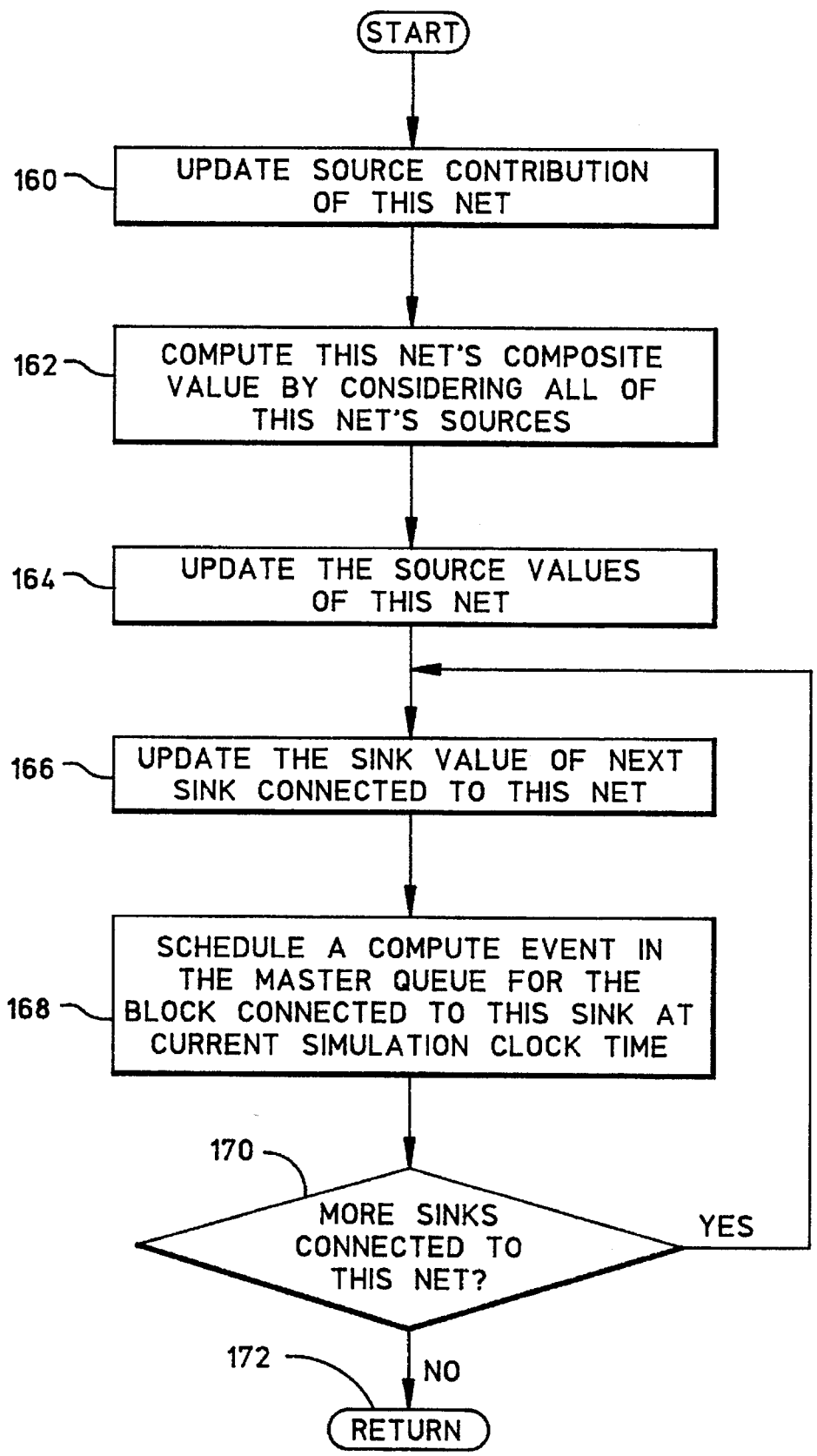
FIG. 6 is a flow diagram that illustrates the processing steps performed by the Multi-Source, No Wire Delay update processor of FIG. 2.

FIG. 6 illustrates the processing steps followed by the "multiple source, without wire delay" update processor. This processor is called when the output value of a source block for a net is scheduled to change. That is, a change in each source of a net results in an update event to determine the new value of the net. The first step of the net update function, represented by the flow diagram box numbered 160, is to update the source contribution of the net corresponding to this update event. Next, the composite value of the net is computed by considering all of the net's sources, this being a multiple source net. This step is represented by the flow diagram box numbered 162.

The next step, represented by the FIG. 6 flow diagram box numbered 164, is to update the source values of this net. This step comprises setting the output pins of all the source blocks connected to the net equal to the new composite value of the net. In terms of the FIG. 3 multiple-source net 90, this step comprises setting the pins 91 and 92 of the B and C source blocks, respectively, to the new value of the net.

Next, the processing updates the sink value of the next sink connected to this net, represented by the FIG. 6 flow diagram box numbered 166, by setting the input pin of the sink block equal to the new net value. The next step is to schedule a compute event in the master queue for the block connected to this sink at the current simulation clock time. This step is represented by the flow diagram box numbered 168. Next, the update processor checks to determine if additional sinks are connected to this net, as represented by the decision box numbered 170. If additional sinks are connected, then processing returns to the flow diagram box numbered 166 to update the value of the next sink. If no additional sinks are connected to this net, then processing returns to the dispatcher, as indicated by the return block numbered 172.

Again relating this processing to FIG. 3, the update of the net 90 comprises computing the new net value by considering the net source value that changed, applying the new net value to the input pins 94, 95 of each sink block C and E connected to the net, and scheduling a compute event on the master queue for each sink block for the computation of a new block output value.

The operation of the multi-source, without wire delay update processor will be further understood with reference to the following pseudo code, which provides a text description of the processing steps illustrated in FIG. 6:

```
Multi-Source, No Wire Delay Update
Processor--executed at the time that
the output value of the Source Block
is scheduled to change.
Update the source contribution value
        of this Net by setting the value
        from the Event in this source's
        value contribution field in this
        Net's multi-source value list;
Compute this Net's composite value
        based on the contribution values
        from all of the sources in this
        Net's multi-source value list;
Update the source values of this Net
        by setting the output Pins of all
        the Source Blocks connected to
        the Net from the composite value;
Sink Update Loop
        For each Sink connected to
                this Net:
                Update the sink value by
                        setting the input
                        Pin value of the
                        Sink Block
                        connected to the
                        Net from the
                        composite value;
                Schedule a Compute Event
                        at the current
                        Simulation Time for
                        the Sink Block
                        connected to this Net;
                END of Sink Update Loop;
Return to Dispatcher.
END.
```

The processing illustrated by the pseudo code should be clear, in view of the description of the flow diagram of FIG. 6, without further explanation.

FIG. 7 illustrates the processing steps followed by the "single source, with wire delay" update processor. This processor is called when the output value of a source block is scheduled to change and the net definition specifies that wire delay for the net is to be considered. The first step is to update the source value of the net associated with this update event, as indicated by the flow diagram box numbered 190. Again relating this step to the net 86 illustrated in FIG. 3, this step involves setting the source point of the net equal to the value of the pin 84 for the source block A.

Because this processing considers the wire delay of the net, an intermediate or temporary value must be kept for later application at the end of the net after the wire delay time. Thus, the next step is to update the intermediate sink value of the next block connected to this net (assuming one or more sink blocks connected to the net). This is accomplished by specifying the intermediate net value in a wire delay propagate compute event for the sink block. The next step, as represented by the flow diagram box numbered 194, is to schedule the wire delay propagate compute event on the master queue at the current simulation clock time for the sink block. This will result in the wire delay being computed and applied to the sink block at the appropriate time. The next step is to check for additional sinks connected to this net, as represented by the decision box numbered 196. If additional sinks are connected, then processing returns to the update box numbered 192. If no additional sinks are connected to this net, then processing returns to the simulation dispatcher, as represented by the return box numbered 198.

In the preferred embodiment of a simulation system incorporating the wire delay support feature of the present invention, the processing of the single source, without wire delay function as illustrated in FIG. 5 and the processing of the single source, with wire delay function as illustrated in FIG. 7 are implemented by the same update processor. That is, in the system illustrated in FIG. 2, a single update processor performs the two functions. The reduced number of update processors otherwise needed helps to reduce the complexity of the simulation system and increase the efficiency of execution. For example, a single subroutine call can be made to a single source update processor, reducing the amount of software code needed to implement the update processing. The performance of both update functions with one processor is made possible through the data structures implemented in the simulation system, as described more fully below.

The operation of the single source, with wire delay update processor will be further understood with reference to the following pseudo code, which provides a text description of the processing steps illustrated in FIG. 7:

```
Single Source, With Wire Delay Update
Processor--executed at the time that the
output value of the Source Block is
scheduled to change.
Update the source value of this Net by
    setting the output Pin value of
    the Source Block connected to the
    Net equal to the value specified
    in the event;
Sink Block Loop
    For each Sink connected to
    this Net:
        Update the intermediate
            Sink value by setting
            the value in the Wire
            Delay Propagate
            Compute Event for
            the Sink Block equal
            to the value specified
            in the event;
        Schedule the Wire Delay
            Propagate Compute
            Event on the Master
            Queue at the current
            Simulation Time for
            the Sink Block
            connected to the Net;
    END of Sink Block Loop;
Return to Dispatcher.
END.
```

The processing illustrated by the pseudo code should be clear, in view of the description of the flow diagram of FIG. 7, without further explanation.

FIG. 8 illustrates the processing steps followed by the "multiple source, with wire delay" update processor. This processing is carried out when one of the sources of a net changes value. Thus, the processing steps of FIG. 8 propagate the changed value throughout the net. The first step is to update the source contribution of the net associated with this update event, as indicated by the flow diagram box numbered 210, by setting the source output pin values obtained by virtue of the change in the net source block. Relating this step to the FIG. 3 circuit, for example, if the output of the block B is changing, then this step updates the new block B output value at the pin 91.

Next, a source value change flag is set corresponding to the source that changed its value, as represented by the FIG. 8 flow diagram box numbered 211. At the flow diagram box numbered 212, the composite value of this net is computed by considering all of the net's sources. Again, in the case of a multiple source net such as the net 90 illustrated in FIG. 3, the update processor determines the output value of the net by carrying out combinational rules of either logical sum or logical product calculations, as specified at the time of simulation system initialization. Whether a logical sum or logical product is used depends upon the particular net being modeled, as will be appreciated by those skilled in the art.

The next step, represented by the FIG. 8 flow diagram box numbered 214, is to update the source values of this net by setting the source pins connected to the net equal to the combinational value. In the case of the FIG. 3 net 90, for example, this step comprises setting the source block pins 91 and 92 equal to the new net value determined by the specified multiple-source combinational rules. Next, at the FIG. 8 flow diagram box numbered 216, the intermediate sink value of this sink is updated by setting the intermediate value in a wire delay propagate compute event for this sink block at the current simulation block time. Next, at the flow diagram box numbered 218, a wire delay propagate event is scheduled in the master queue for the block connected to this sink at the current simulation clock time. Finally, the update processor checks to determine if additional sinks are connected to this net, as represented by the decision box numbered 220. If there are additional sinks, then processing returns to the flow diagram box numbered 216 for additional updating. If no additional sinks are connected to the net, then processing returns to the dispatcher, as represented by the return box numbered 222.

The operation of the multi-source, with wire delay update processor will be further understood with reference to the following pseudo code, which provides a text description of the processing steps in FIG. 8:

```
Multi-Source, With Wire Delay Update
Processor--executed at the time that the
output value of the Source Block is
scheduled to change.
Update the source contribution value of
    this Net by setting the value from
    the Event in this source's value
    contribution field in this Net's
    multi-source value list;
Set a source value change flag to remember
    which source changed value (the
    flag is used by the Wire Delay
    Propagate Compute Event to select
    the appropriate delay pair);
Compute this Net's composite value based
    on the contribution values from all
    of the sources in this Net's
    multi-source value list;
Update the source values of this Net by
    setting the output Pins of all the
    Source Blocks connected to the
    Net from the composite value;
Sink Update Loop
    For each Sink connected to this Net:
        Update the intermediate
            sink value by setting
            the value in the Wire
            Delay Propagate
            Compute Event for
            the Sink Block;
        Schedule the Wire Delay
            Propagate Compute
            Event in the Master
            Queue at the current
            Simulation Time for
            the Sink Block
```

```
            connected to this Net;
        END of Sink Update Loop;
Return to Dispatcher.
END.
```

The processing illustrated by the pseudo code should be clear, in view of the description of the flow diagram of FIG. 8, without further explanation.

FIG. 9 illustrates the processing of the "wire delay sink value" update function. This processing is implemented when the wire delay of a net is to be modelled, and is scheduled to be invoked at a simulation clock time equal to the time when the output value of a source block is scheduled to change plus the wire delay value of the net. The first step performed, represented by the flow diagram box numbered 240, is to update the sink value of the sink block connected to this net by setting the input pin of the sink block connected to the net equal to the value specified in the wire delay update event. The next step is to schedule a compute event in the master queue, as indicated by the flow diagram box numbered 242. The compute event is set to occur at the current simulation clock time for the sink block connected to this net. Finally, processing returns to the simulation dispatcher at the return box numbered 244.

The operation of the wire delay sink value update processor will be further understood with reference to the following pseudo code, which provides a text description of the processing steps illustrated in FIG. 9:

```
Wire Delay Sink Value Update
Processor--executed at the time that
the output value of the Source Block
is scheduled to change plus the wire
delay time of the Net to the Sink Block.
Update the sink value by setting the
        input Pin value of the Sink Block
        connected to the Net from the
        value specified in the event;
Schedule a Compute Event in the
        Master Queue at the current
        Simulation Time for the Sink
        Block connected to the Net;
Return to Dispatcher.
END.
```

The processing illustrated by the pseudo code should be clear, in view of the description of the flow diagram of FIG. 9, without further explanation.

In the preferred embodiment, two types of compute processors are supported. The first compute processor is referred to as a circuit type compute processor, which is executed at the time the input value of a sink block changes. The processor determines the new output value of the sink block. The other type of compute processor is a wire delay propagate compute processor, which is executed at the time that the output value of the source block associated with the net is scheduled to change.

Figure 10:
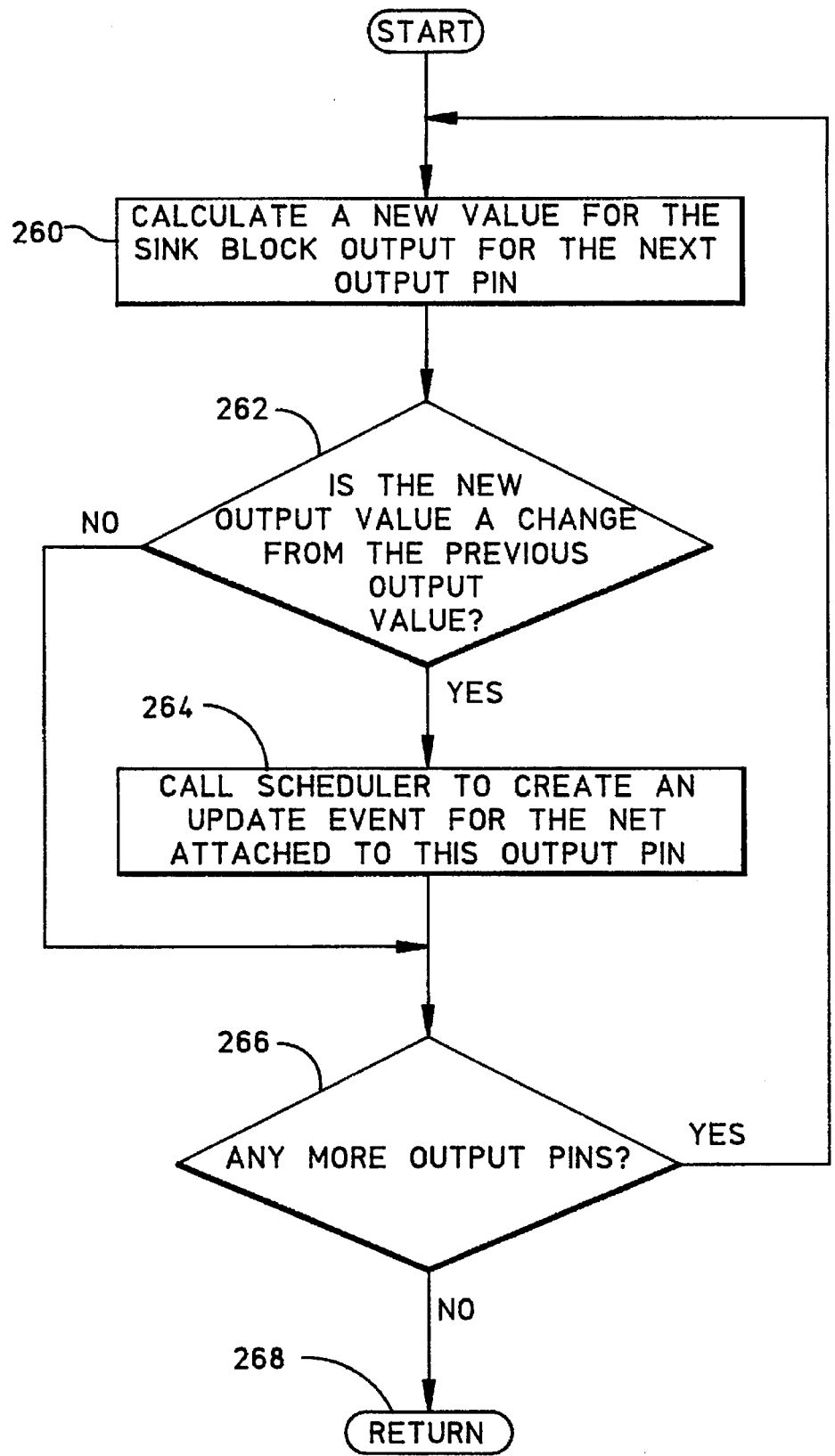
FIG. 10 is a flow diagram that illustrates the processing steps performed by the Circuit compute processor of FIG. 2.

FIG. 10 illustrates the processing steps followed by the "circuit type" compute processor. This processor is called when the input value of a sink block changes and a new output value for the block must be computed. The first step is to calculate a new value for the sink block output for the next output pin of this block, as indicated by the flow diagram box numbered 260. The next step, represented by the decision box numbered 262, is to determine if the new output value is a change from the previous output value. If a change has occurred, an affirmative outcome at the decision box, then the next step is to call the scheduler to create an update event for the net attached to this output pin, as represented by the flow diagram box numbered 264. The next step after creating a net update event, and also if the outcome at the decision box numbered 262 was negative, is to determine if any additional output pins remain to be processed for this sink block, as represented by the decision box numbered 266. If additional output pins remain, then processing returns to the flow diagram box numbered 260 for additional processing. If no additional output pins remain, then processing returns to the dispatcher, as represented by the return box numbered 268.

The operation of the circuit compute processor will be further understood with reference to the following pseudo code, which provides a text description of the processing steps illustrated in FIG. 10:

```
Circuit-Type Compute Processor--
executed at the time that the input
value of the Sink Block changes
Output Pin Loop
    For each output Pin:
        Calculate a new output
            value based on the
            input Pin values
            for this Block;
        If the new output value is
            a change from the
            previous value of
            this output, then:
            Call Scheduler to
                create an
                Update Event
                of the
                appropriate
                type for the
                Net attached
                to this output
                Pin;
    END of Output Pin Loop;
Return to Dispatcher.
END.
```

The processing illustrated by the pseudo code should be clear, in view of the description of the flow diagram of FIG. 10, without further explanation.

Figure 11:
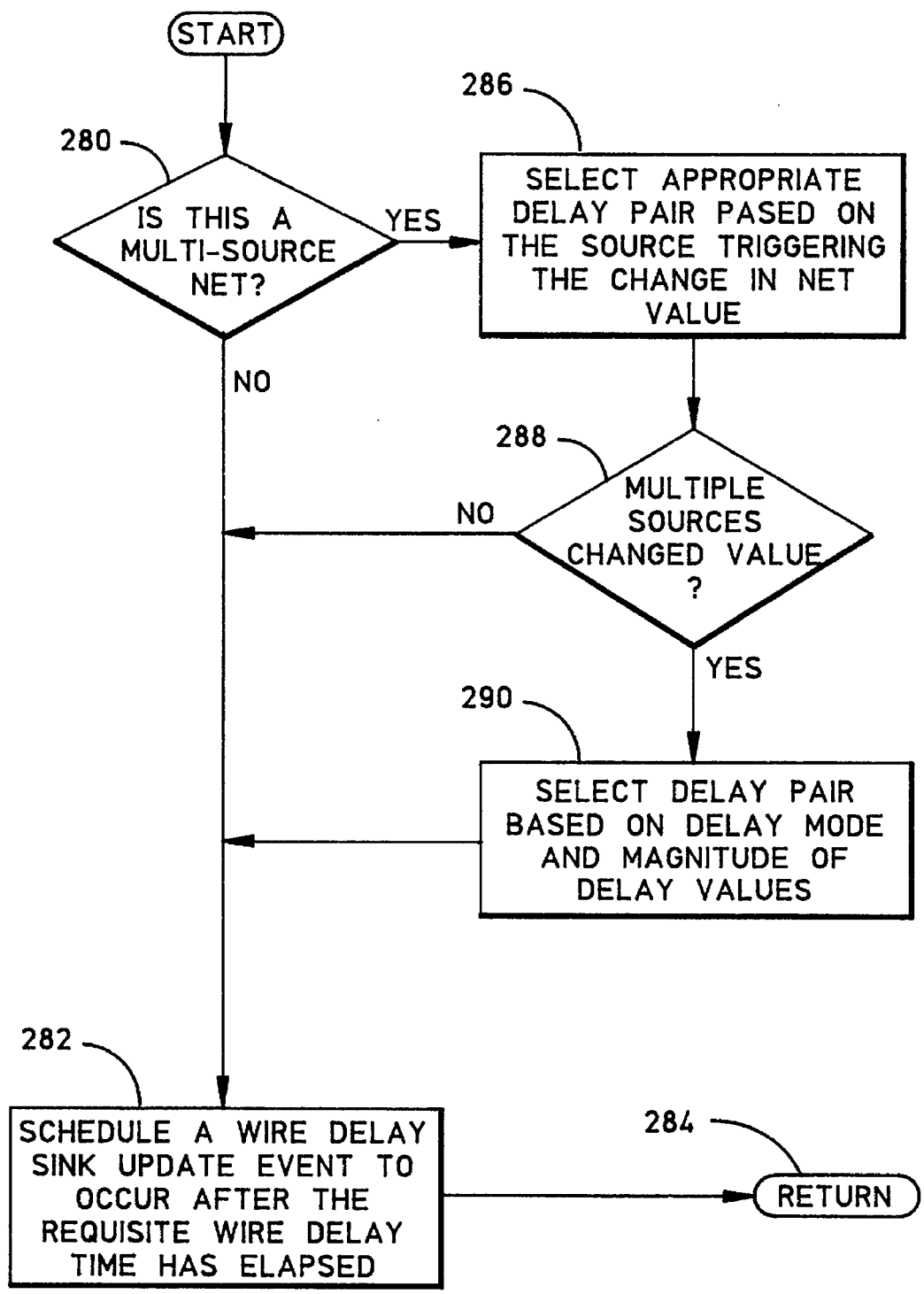
FIG. 11 is a flow diagram that illustrates the processing steps performed by the Wire Delay Propagate compute processor of FIG. 2.

FIG. 11 illustrates the processing steps implemented by the "wire delay propagate" compute processor. This processor is called when an output value change is scheduled for a source block to a net having a wire delay value. The first step in the processing, represented by the decision box numbered 280, is to determine if the net corresponding to this compute event is a multiple source net. If it is not a multiple source net, then the next processing step carried out is to schedule a wire delay sink update event to occur after the requisite wire delay time has elapsed, as represented by the flow diagram box numbered 282. Processing then returns to the simulation dispatcher, as represented by the return box numbered 284.

If the net is a multiple source net, an affirmative outcome at the decision box numbered 280, then the next processing step is to select an appropriate delay time, net value pair based on the source that triggered the change in the net value, as represented by the flow diagram box numbered 286. The next step is to determine if multiple sources changed in value, as represented by the decision box numbered 288. If multiple sources did not change value, then only a single value changed, and processing can proceed directly to scheduling the update event at the flow diagram box numbered 282. If multiple sources did change value, then the next processing step is to select a delay pair based on the delay mode being implemented and the magnitude of the delay values. For example, the delay mode might comprise either a best case selection or a worst case selection for the delay time. Similarly, either the largest or smallest magnitude delay value might be selected. As noted above, the combinational rules for specifying the output value of a multiple source net are determined at the time of logic circuit definition by the user. In any case, a single delay value is selected and processing then moves to the flow diagram box numbered 282 for the scheduling of a wire delay sink update event.

The operation of the wire delay propagate compute processor will be further understood with reference to the following pseudo code, which provides a text description of the processing steps illustrated in FIG. 11:

```
Wire Delay Propagate Compute
Processor--executed at the time that
the output value of the Source
Block is scheduled to change.
If this is a multi-source Net, then:
    Select the appropriate Delay
        Pair based on which
        Source is triggering the
        Net's value change (this
        is done via the source
        change flags set by the
        Multi-Source With
        Wire Delay Update
        Processor);
    If multiple sources changed, then:
        Select between the Delay
            Pairs based on
            the delay mode
            (Best-case vs.
            Worst-case) and
            the magnitude of
            the delay values;
Schedule a Wire Delay Sink Update
    Event to update the Net's sink
    value after the requisite wire
    delay time has elapsed;
Return to Dispatcher.
END.
```

The processing illustrated by the pseudo code should be clear, in view of the description of the flow diagram of FIG. 11, without further explanation.

Figure 12:
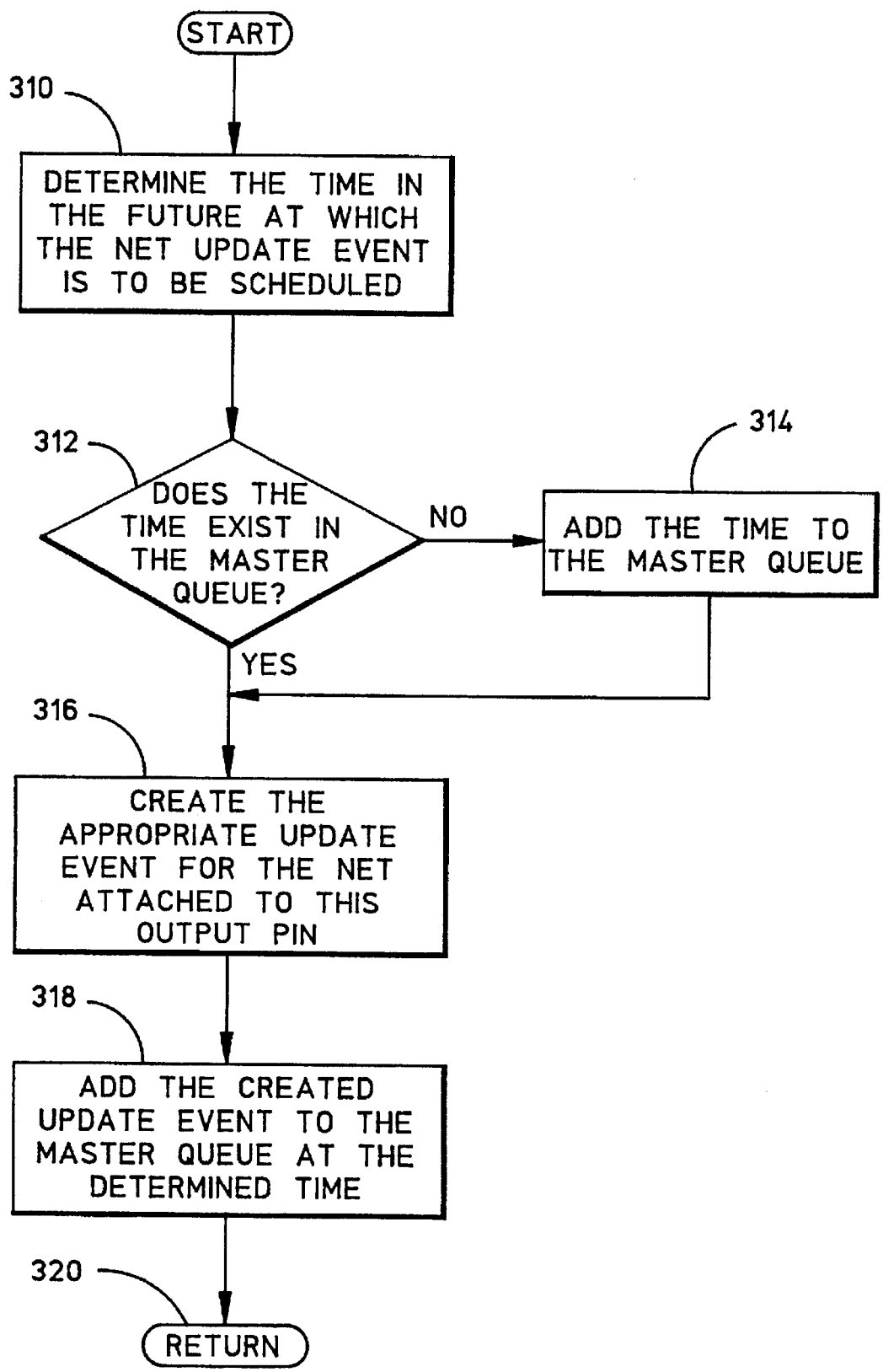
FIG. 12 is a flow diagram that illustrates the processing steps performed by the Scheduler of FIG. 2.

FIG. 12 illustrates the processing steps followed by the scheduler illustrated in FIG. 2. The scheduler is called when the output pin of a block changes value. The first step shown in FIG. 12, represented by the flow diagram box numbered 310, is to determine the simulation clock time in the future at which the net update event is to be scheduled. This is represented by the flow diagram box numbered 310. The next step is to check whether the time exists in the master queue, as represented by the decision box numbered 312. If the time in the future does not already exist in the master queue, then the scheduler adds that time to the master queue, as indicated by the flow diagram box numbered 314. Once the scheduler is certain that the time exists in the master queue, then the next processing step, represented by the flow diagram box numbered 316, is to create the appropriate update event for the net attached to this output pin. Next, the scheduler adds the created update event to the master queue at the determined future time, as represented by the flow diagram box numbered 318. Finally, processing returns to the dispatcher, as represented by the return box numbered 320.

The operation of the scheduler will be further understood with reference to the following pseudo code, which provides a text description of the processing steps illustrated in FIG. 12:

```
Pseudo-code for the processing of the Scheduler:
    Scheduler Processing--
        used for scheduling a Block's output
        Pin value change.
        Find the appropriate time in the future
            in the Master Queue at which
            the net Update Event is to be
            scheduled (this is based on the
            Block's circuit delay time);
        If the time does not yet exist in the
            Master Queue, then:
                Add the time to the Master Queue;
        Create the appropriate Update Event
            type for the Net attached to the
            output Pin;
        Add the Update Event to the Master
            Queue at the identified time;
        Return to the Compute Processor.
    END.
```

The processing illustrated by the pseudo code should be clear, in view of the description of the flow diagram of FIG. 12, without further explanation.

Figure 13:
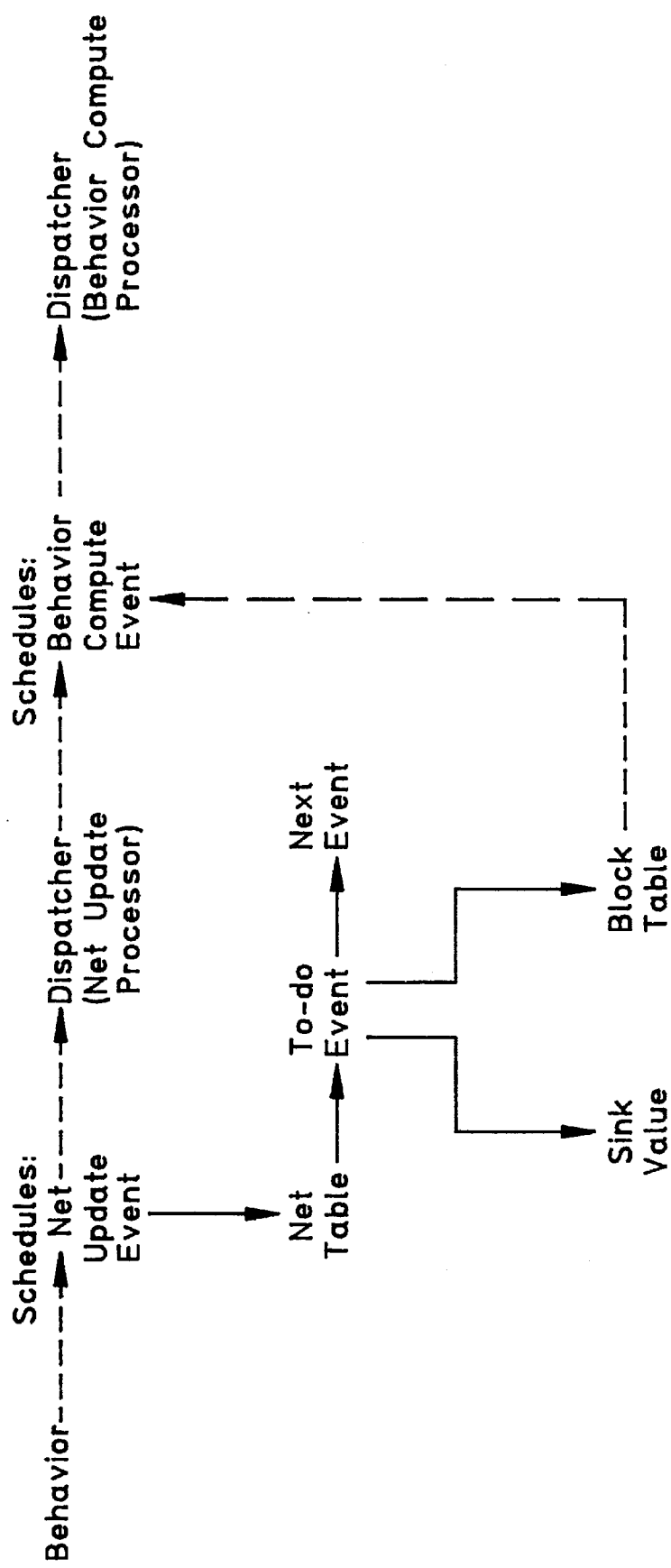
FIG. 13 is a representation of the event flow and data structures for update event processing for nets without wire delays, as modelled by the system illustrated in FIG. 1.
Figure 14:
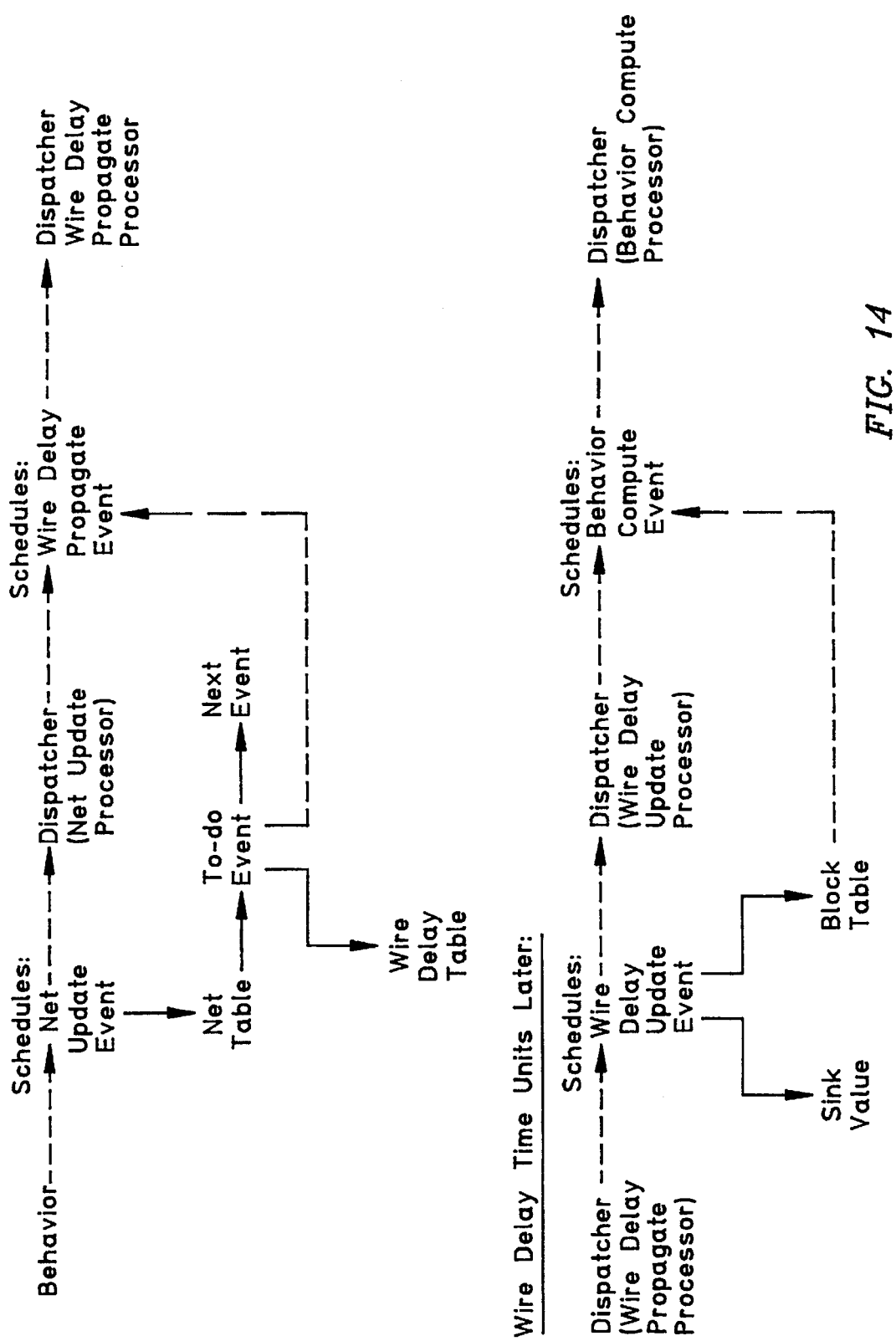
FIG. 14 is a representation of the event flow and data structures for update event processing for nets with wire delays, as modelled by the system illustrated in FIG. 1.

As noted above, the system illustrated in FIGS. 1 and 2 supports simulation of wire delay values for nets without incurring significant processing penalties for the simulation when the processing for wire delay is compared with the processing without wire delay. The operation of the system, illustrating the processing with and without wire delay, will be better understood with reference to FIG. 13 and FIG. 14. FIG. 13 shows the event flow and data structures used in the update processing for nets whose wire delays are not being considered and FIG. 14 shows the event flow and data structures used in the update processing for nets whose wire delays are being considered in the simulation. More particularly, event flow is illustrated by the dashed line that crosses from left to right and the data structures referenced by each event are illustrated below the dashed line.

In FIG. 13, a circuit block or logic component provides a predetermined logic function, which is designated a "Behavior". The Behavior can comprise, for example, a logic gate, a memory register, or a processor, each of which has an output value that changes over time as input values change. As noted above, a simulation user can specify when an input value is to be changed. The scheduler can thereby determine when a Behavior output value is to be updated, and accordingly schedules a net update event so that the output value of the block (the result of the Behavior) is received at the source end of a net and is provided to the sink end of the net for the current simulation time. The net value can then be applied as the input to the logic block to which the net is connected and the output of the block can be computed via a compute event.

Figure 15:
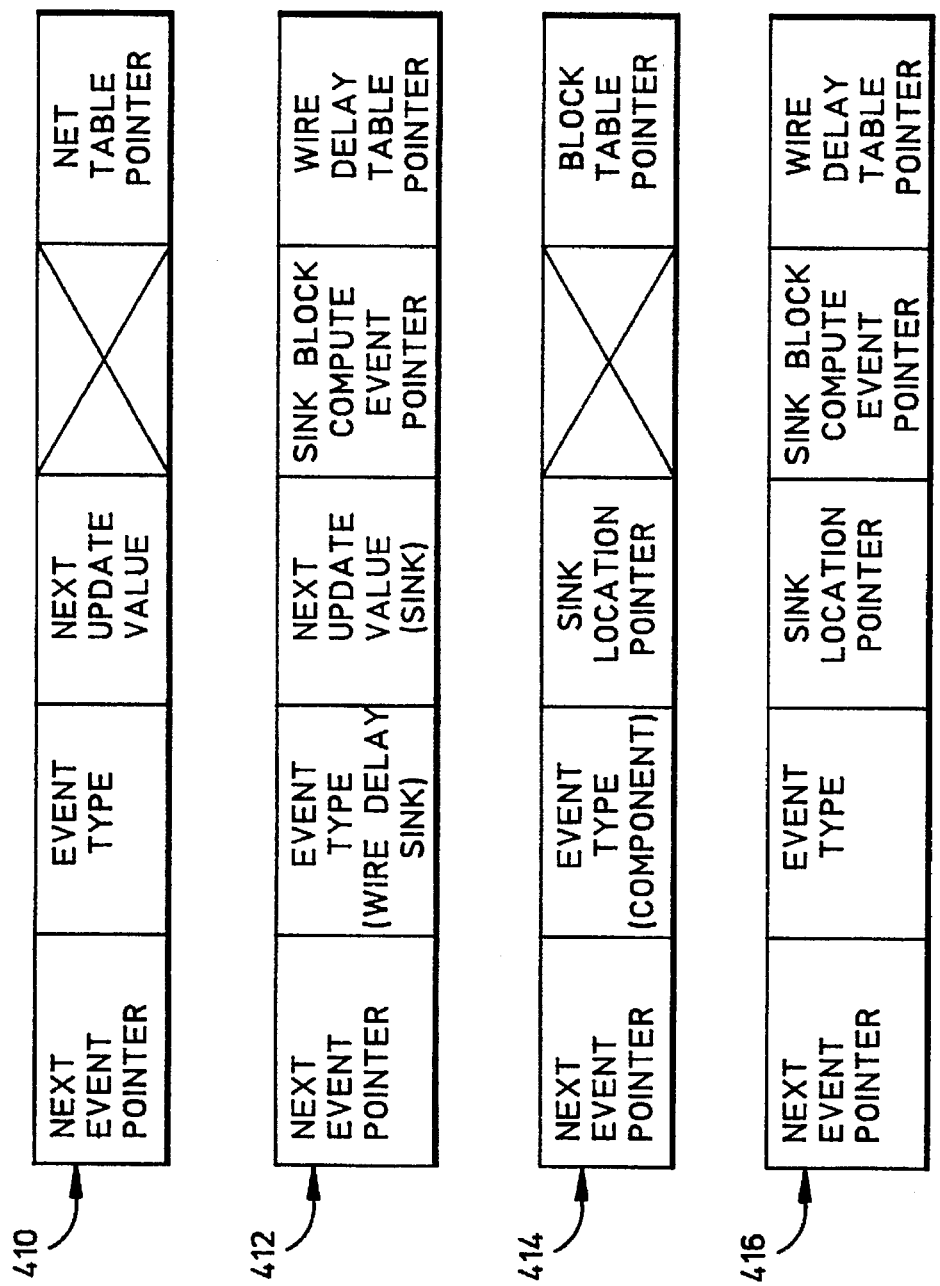
FIG. 15 is a representation of the event table data structure accessed during the processing illustrated in FIG. 13 and FIG. 14.

The update events and compute events are specified in the simulation system of FIGS. 1 and 2 by a variety of data structures depending on the nature of the event. FIG. 15 illustrates a single/multiple source net update event data structure 410, a wire delay sink update event data structure 412, a circuit type compute event data structure 414, and a wire delay propagate compute event data structure 416. Each event data structure in FIG. 15 includes various data fields. The relative alignment of the data fields between data structures indicates that the respective fields occur at the same relative point in the data structures, thus simplifying processor operation. Unused fields that are padded with fill characters are indicated by an "X" in the field.

As illustrated in FIG. 15, the single/multi source net update event data structure 410 includes a next event pointer, an event type data field, a net update value field, and a net table pointer. The next event pointer comprises a pointer to the next event, if any, that is to occur at the current simulation clock time. For example, multiple sources of a net might be changing value at the same simulation clock time and therefore would have associated update events linked by pointers. The event type field is an indicator of whether the event is a net update event, compute event, and so forth. The net update value (referred to above in connection with the flow diagrams of FIGS. 5–8) represents the value being passed in a net update event. The net table represents a location in memory where the net name, connections, logic processing, and the like are kept.

The wire delay sink update event data structure 412 illustrated in FIG. 15 includes the next event pointer and event type data fields, but in place of the net update value and net table pointer of the net update event includes a net update value for the sink connected to the net, a pointer to the compute event for the sink block, and a wire delay table pointer that specifies wire delay values. These wire delay values are typically represented by delay pair values that specify a delay in the case where the changed logic signal value to be propagated over the net comprises a rising value (from data value 0 to data value 1) and also in the case where the value to be propagated comprises a falling value (changing from 1 to 0).

The component compute event data structure 414 of FIG. 15 contains the same first two fields as the others and then includes a pointer to a sink value and then a pointer to a block table. The sink value comprises the input pin value for the block whose output value is to be computed, and the block table is a data structure (described more fully below) that specifies the block processing and the output value to be computed. The component compute event data structure 414 is used by the circuit compute processor (see FIG. 10).

Finally, the wire delay propagate compute event data structure 416 again contains the same first two fields as the other event data structures, and then includes a pointer to the sink location values in memory, a pointer to the sink block compute event, and a pointer to the wire delay table where the wire delay pair values described above are kept. This data structure is used by the wire delay propagate compute processor (see FIG. 11).

As noted above, FIG. 13 shows the case of a net for which no wire delay value is being considered, and illustrates that the scheduler pulls a net update event from the master queue and retrieves the single/multi-source update event data structure 410 (as indicated by the event type field) and is directed to the net table pointer. As illustrated in FIG. 13, the net table is associated with a list of compute events to be executed, comprising what is called a "To-Do" event list. The scheduler passes control to the appropriate net update processor specified by the event type data field in the update event data structure and the appropriate processing is executed, as illustrated above in connection with FIGS. 5–8.

Figure 16:
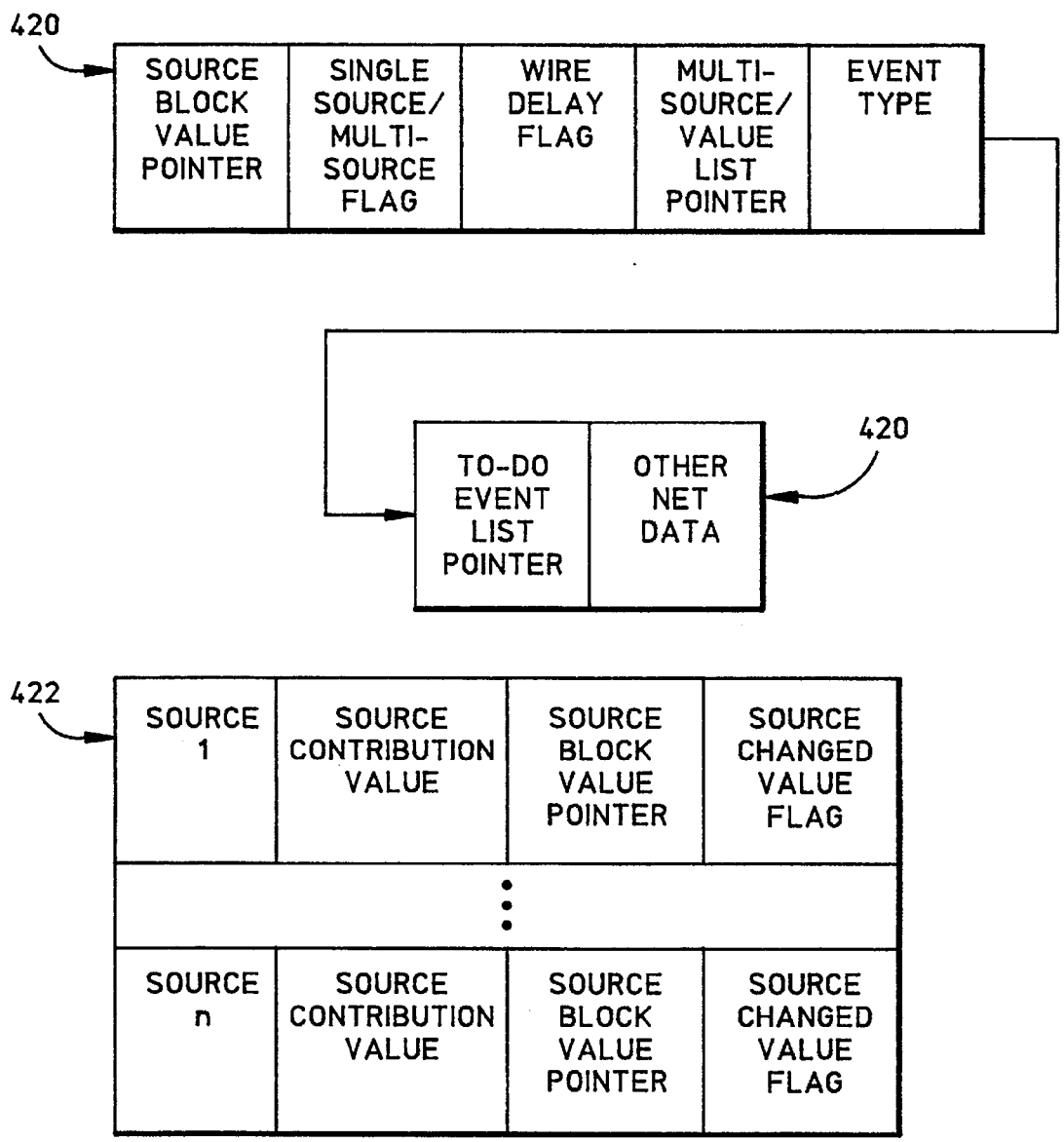
FIG. 16 is a representation of the net table data structure accessed during the processing illustrated in FIG. 13 and FIG. 14.

FIG. 16 is an illustration of the net table data structure 420 pointed to by the net table pointer of the net update event. FIG. 16 shows that the net table includes a pointer to a source block value area of memory at which is kept the output value of the source block(s) connected to the net. The next field illustrated in FIG. 16 is a single/multi-source flag to indicate which is the case for this net. The next field contains a flag to indicate whether wire delay is being considered for this net. The next field in the net table is for a pointer to a multi-source value list data structure, when applicable. The multi-source value list data structure 422 also is illustrated in FIG. 16 and comprises an array with one entry row per source connection. In the net table, after the multi-source list pointer, the next field is the event type designation, used to specify the update event processing.

The next field in the net table data structure 420 of FIG. 16 is a pointer to the To-Do event list containing a list of the compute events to be scheduled when this net changes values. It should be understood that the To-Do list is created at the time of system initialization (see FIG. 4) by the user as part of the system specification. That is, at initialization, the user specifies the net connections to a block in accordance with the simulation system. Therefore, whenever the net value changes, the value of the sink circuit must be computed and passed to the sink block(s) connected to the net. The To-Do list is the means by which the system, in accordance with the present invention, determines what processing should be carried out. More particularly, when the dispatcher passes control to the appropriate net update processor, the To-Do list tells the processor what compute events to schedule on the master queue. The processor simply duplicates the listed compute events and puts them on the master queue at the proper simulation clock time. The To-Do list is maintained in the program/data memory.

The last field in the net amble data structure 420 is reserved for other net data not pertinent to the present invention but typically used by the simulation system that incorporates the wire delay feature of the present invention. Such data might include, for example, display parameters, operating options, and other processing fields. This other data is implementation specific, as will be understood by those skilled in the art, and requires no further explanation.

As noted above, the multi-source value list data structure 422 illustrated in FIG. 16 includes one entry per source connection. At each entry, a source contribution value field contains the value of the source contribution to the net, as mentioned above in connection with FIGS. 5–8. The next item in the list is a pointer to a source block value area that contains the value of the source and, lastly, the list contains a flag that indicates when the source has changed value. The flag is used by the multi-source, with wire delay update processor (FIG. 8).

Returning to FIG. 13, the To-Do event is shown as being associated with sink value and block amble data structures. These data structures are pointed to by the compute event data structures 414, 416 illustrated in FIG. 15. Recall that the To-Do list comprises the compute events to be executed at a net update. Each compute event has a pointer to the memory location where the sink value (which the net is being updated with) is to be applied. This is the step being executed, for example, at flow diagram box 142 of FIG. 5. Each compute event also has a pointer to a block table associated with the block connected to the net. The block table specifies the block characteristics and permits the computation of the new block output value, which follows as a result of the change in net value.

Figure 17:
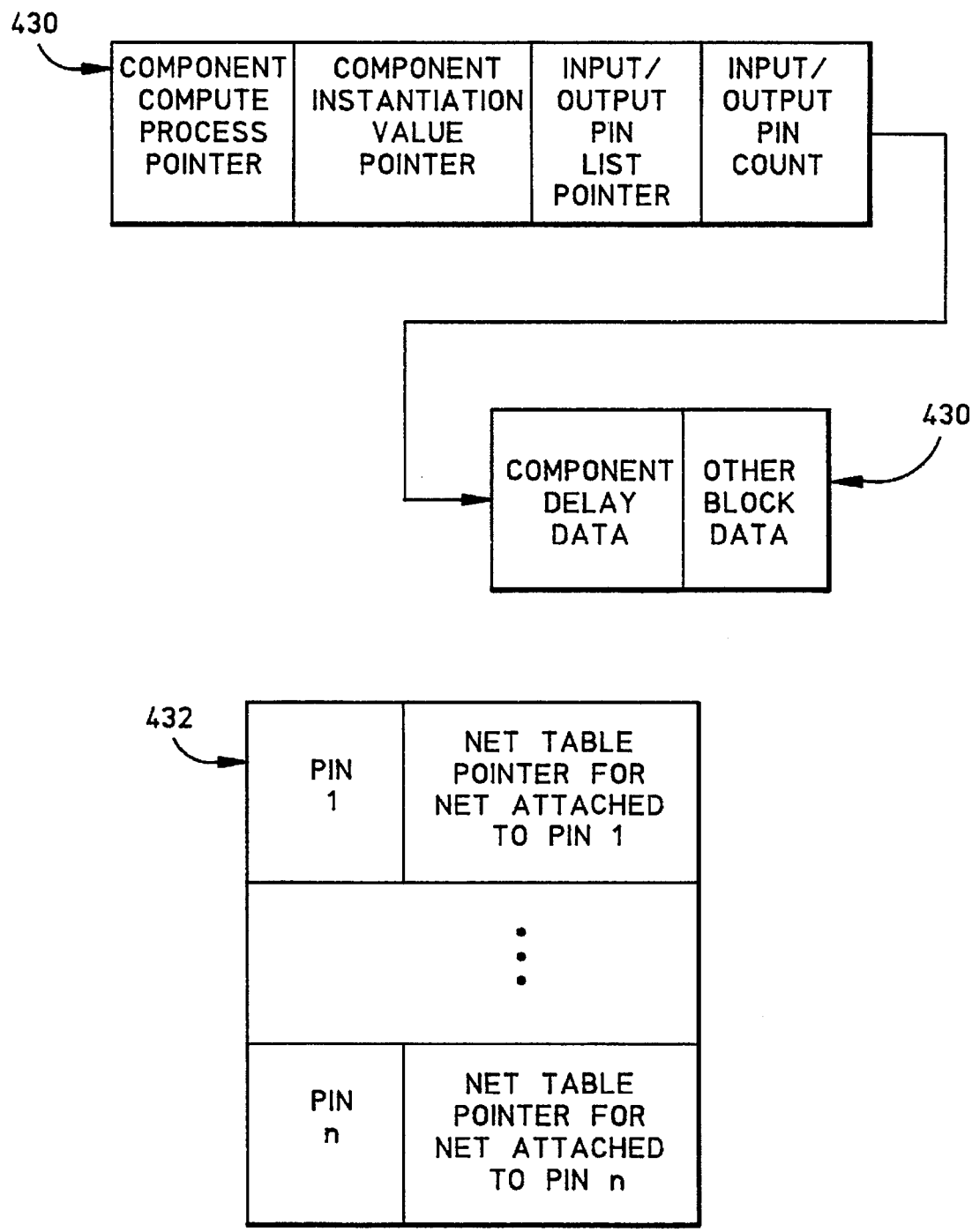
FIG. 17 is a representation of the block table data structure accessed during the processing illustrated in FIG. 13 and FIG. 14.

FIG. 17 illustrates the block table data structure 430. FIG. 17 shows that the first field in the amble is a pointer to the component compute routine for the block. Recall that the blocks of the simulation system correspond to logic components being modelled. Thus, each component has a corresponding computation routine, such as for an AND gate, a memory register, a multiplexer, or a processor. This pointer points to the appropriate code. The next entry in the block table is a pointer to what is called the component instantiation value space. This space is the memory area in which the values associated with this particular logic circuit component are kept, so that each component remains distinct and can exist and change independently of the other components in the circuit being simulated.

The next entry in the table 430 is a pointer to a list of the input and output pins of the component block. FIG. 17 includes a representation of the input/output pin list data structure 432. The data structure comprises an array with one entry per input pin and output pin. Associated with each pin entry is a pointer to the net table of the net attached to the pin. The net table information is used to indicate where the source value should be obtained or where the block output should be placed, as appropriate.

Next in the block table 430 is a count of the number of input and output pins. This information is used in carrying out the compute processing. Next in the block table is a field for component delay information, used when scheduling output update events. This delay information comprises, for example, the amount of delay time associated with the processing for this component block. It should be apparent that the time needed for a logic signal to propagate through a logic gate (such as an AND gate or an inverter) is different from the time needed for a logic signal to propagate through a complex processor, a multiplexer, or the like. The delay time information contains such data. Finally, the simulation system may require other information associated with each block, as indicated by the "other block data" field.

Returning once again to FIG. 13, after the net update processor schedules the necessary compute events for the To-Do list, the actual compute events are eventually retrieved from the master queue, whereupon the dispatcher passes control to the appropriate compute processor. The compute processor processing steps were described above in conjunction with FIGS. 10 and 11.

In FIG. 14, the top portion of the drawing represents the processing that updates the net value and schedules the wire delay propagation. That is, the output of the net must be determined, considering multiple sources and combinational nets if necessary, and then the output must be applied to the sink end of the net after a specified number of simulation clock time units have expired, thereby simulating the wire delay. Thus, the top portion of FIG. 14 is identical to the flow illustrated in FIG. 13 except that in the case of the wire delay processing of FIG. 14, the To-Do event pointed to by the net table is a wire delay propagate event. As illustrated in FIG. 15, a wire delay propagate event data structure 416 is associated with a wire delay table.

It should be noted that the To-Do event list appears the same for the wire delay (FIG. 13) and non-wire delay (FIG. 14) processing, in that the net update processor goes to the net table associated with the net being updated, finds the To-Do event list, and processes the list. Therefore, the same update processor can implement the wire delay and the non-wire delay simulation. More particularly, in the case of the non-wire delay, the To-Do event list points to a location in which to place the new sink value, whereas in the case of the wire delay, the To-Do event list points to a wire delay table, where the sink value is temporarily saved. The net update processor is unaware of the difference when it executes the To-Do list.

FIG. 18 is a representation of the wire delay table data structure 440. FIG. 18 shows that the first field of the table is for a single/multi-source data flag which is used to differentiate the processing to be followed (see FIG. 11). Next is a pointer to the multi-source value list, where applicable, which comprises a list of the source values for each source connected to this net (see the multi-source value list data structure 422 of FIG. 16). The next field is an event type field that is used by the wire delay sink value update event processor (see FIG. 9) for creating the wire delay sink update event. Next is a pointer to the net table associated with this net, whose wire delay is being computed. Finally, the wire delay table contains a rising/falling delay pair or each source connection. As noted above, wire delay values typically are represented by a rising delay value that specifies the delay through a net when the logic signal changes from a low value to a high value and a falling delay value that specifies the delay through the net when the logic signal changes from a high value to a low value. This information is contained in the delay pair data field of the wire delay table data structure 440.

Thus, the wire delay table includes sink values and delay values for the sinks. That is, each sink of the associated net will have its own To-Do event, specified by the user at initialization, and therefore each sink will have its own wire delay table. Moreover, each sink will have its own To-Do event whether or not wire delay is being considered. This should be apparent from examination of FIGS. 13 and 14.

With respect to the FIG. 3 net 90, for example, the sink at the C block pin 94 will be associated with a net table and a To-Do event list, as will the sink at the E block pin 95. That is, the net 90 has a net table associated with it and the net table points to two To-Do events, one To-Do event for the computation of the C block pin and the one To-Do event for the computation of the E block pin. Thus, the To-Do event for the C block also will have a sink pointer pointing to the location for the C block pin 94 and the To-Do event for the E block also will have a sink pointer pointing to the location for the E block pin 95.

The C block will have a block table that will specify compute processing that will combine the input sink values from the pins 88 and 94 to provide the proper C block output. Similarly, the net 86 will have a net table pointing to a To-Do event list that in turn points to the location for the sink 88 and to the C block table. In this way, the net update processors are unaware if they are being pointed to a sink value location or to a wire delay table because the processor simply carries out the sink update processing. This update processing comprises, for example, flow diagram box 142 of FIG. 5, box 166 of FIG. 6, box 192 of FIG. 7, or box 216 of FIG. 8. The differential processing is determined by the event type flag of the compute event specified in the To-Do list.

As noted above, the same update event processor can implement the wire delay and non-wire delay simulation due to the data structures used by the simulation system constructed in accordance with the present invention. The parallelism should be apparent from the processing of the To-Do list and comparison of the processing by the single source net update processors with and without wire delay (FIGS. 5 and 7, respectively) and the multi-source net update processors with and without wire delay (FIGS. 6 and 8, respectively). Using a single net update processor in place of multiple update processors simplifies the simulation system and makes system definition, debugging, and software maintenance easier to perform.

Therefore, in the preferred embodiment, the single source, without wire delay net update processor and the single source, with wire delay net update processor are embodied in one processor. That is, the same processor code performs both functions. The feasibility of such a construction should be apparent by noticing that the program steps set forth by the FIG. 5 flow diagram are exactly analogous to the program steps set forth by the FIG. 7 flow diagram, as illustrated by the similarity in numbering of the respective flow diagram boxes. The different data manipulations are implemented by the different data structures (FIG. 15) but are transparent to the processor.

In both cases of the single source net processing, a sink location pointer is used. In the case of the "without wire delay" processing, the pointer points to a sink. In the case of the "with wire delay" processing, the pointer points to an intermediate sink location in the wire delay table. This difference is transparent to the update processor. In the non-wire delay case, the To-Do event is a component circuit type compute event that is processed as described above. In the wire delay case, the To-Do event is a wire delay compute event, which results in a wire delay sink update event, which then creates a component circuit type compute event.

The multi source net update processing also is similar as between the non-wire delay simulation and the wire delay simulation. This should be apparent from comparison of FIGS. 6 and 8. Also apparent should be the minor difference between the two, which comprises the additional FIG. 8 step of setting the source value change flag (represented by the flow diagram box numbered 211). Again, the parallelism is illustrated by the similarity in the numbering of the boxes in the respective flow diagrams. It should be apparent that one processor could be used to implement the processing steps of the non-wire delay and wire delay cases for multiple source nets, so long as a comparison step was included to check for the appropriate case.

In the preferred embodiment, however, different processors are provided. The dual multi-source processors eliminate the need to test for the non-wire delay and wire delay conditions in the processor code, which makes for slightly more efficient processing and simplifies the design of the processors. Thus, the testing for the delay case is done outside of the respective net update processors, preferably by the dispatcher when the update event is retrieved from the master queue and the appropriate update processor is called (see the flow diagram box numbered 106 in FIG. 4). Either the multi source, without wire delay processor is called or the multi source, with wire delay processor is called.

Thus, a logic simulation system that supports the wire delay feature in accordance with the preferred embodiment of the invention provides a simulation processor in which only those nets that have an associated wire delay that is being modelled will cause a wire delay update event and associated compute event to be invoked. All other nets will not result in wire delay events. The processing penalty incurred in modelling wire delays is thereby minimized, and no processing penalty is incurred at all for those nets whose wire delay is not being considered. In addition, using a single net update processor for single source nets being modelled with and without wire delay minimizes the complexity of the simulation system and thereby simplifies programming, modelling, debugging, and software maintenance.

The present invention has been described above in terms of a presently preferred embodiment so that an understanding of the present invention can be conveyed. There are, however, many configurations for logic simulation systems not specifically described herein but with which the present invention is applicable. The present invention should therefore not be seen as limited to the particular embodiment described herein, but rather, it should be understood that the present invention has wide applicability with respect to logic simulation systems generally. All modifications, variations, or equivalent arrangements that are within the scope of the attached claims should therefore be considered to be within the scope of the invention.

I claim:

1. A combination for the simulation of a digital logic circuit on a processing machine, the combination comprising:

a memory unit having a master queue that contains events to be performed during a simulation of the digital logic circuit in which blocks representing components of the digital logic circuit are connected to each other by nets representing block-to-block wire connections of the digital logic circuit and include input pins that receive input values representing a logic signal;

a scheduler that adds events to the master queue that are associated with a simulation clock time index corresponding to changes in the input values such that each block and net is associated with an update event and a compute event;

a dispatcher that maintains a simulation clock time of the digital logic circuit simulation, extracts events from the master queue according to the simulation clock time of each event, and produces a simulation output;

an update processor that receives update events from the dispatcher and performs update processing necessary to identify a compute event to the dispatcher for scheduling in the master queue; and a compute processor that receives compute events from the dispatcher and performs computations necessary to produce a compute event output value that it returns to the dispatcher;

wherein the scheduler responds to a user indication of a net whose wire delay is to be simulated by scheduling a wire delay update event in the master queue for that net only, and wherein the corresponding update processor responds to the wire delay update event by identifying a wire delay compute event for scheduling in the master queue, such that the wire delay compute event output value is produced at a simulation clock time that accounts for the associated wire delay value.

2. A combination as defined in claim 1, wherein the update processor includes:

a single source, without wire delay processor that determines an output value for a net having a single source, without considering a wire delay value;

a multi-source, without wire delay processor that determines an output value for a net having multiple sources, without considering a wire delay value;

a single source, with wire delay processor that determines an output value for a net having a single source, and considers a wire delay value;

a multi-source, with wire delay processor that determines an output value for a net having multiple sources, and considers a wire delay value; and a wire delay sink value processor that determines the output value of a net, taking into consideration a specified wire delay value for the net.

3. A combination as defined in claim 1, wherein the compute event processor includes:

a circuit component processor that determines the output value of a logic circuit component; and a wire delay propagate processor that determines the output value of a net and the simulation clock time at which the output value should appear at the sink end of the net.

4. A combination as defined in claim 1, wherein the update processor includes a wire delay sink value processor that determines the output value of a net at a current simulation clock time, taking into consideration a specified wire delay value for the net, by updating the input pin value of the logic circuit block connected to the net and then causing a compute event to be scheduled for the logic circuit block at the current simulation clock time.

5. A combination as defined in claim 1, wherein the compute event processor includes a wire delay propagate processor that determines the value of a net that should appear at the sink end of the net at a current simulation clock time by determining if the net is a multi-source net, selecting an appropriate delay time/net value pair in accordance with a predetermined combinational rule, and causing a wire delay sink update event to be scheduled for occurrence at the current simulation clock time plus an added wire delay time in the future.

6. A digital logic simulation system that operates with a processing machine, the system comprising:

a master queue that contains events to be performed during a simulation of a digital logic circuit in which blocks representing components of the digital logic circuit are connected to each other by nets representing block-to-block wire connections of the digital logic circuit and include input pins that receive input values representing a logic signal;

a dispatcher that maintains a simulation clock time of the digital logic circuit simulation, extracts events from the master queue when a current simulation clock time matches a clock time index of each event, and produces a simulation output;

an update processor that receives update events from the dispatcher and performs update processing necessary to identify a compute event to the dispatcher for scheduling in the master queue;

a compute processor that receives compute events from the dispatcher and performs computations necessary to produce a compute event output value that it returns to the dispatcher; and a scheduler that adds update events and compute events to the master queue corresponding to changes in the input values such that each block and net is associated with an update event when a change in input value is to occur and each update event is associated with a compute event to determine any change in output value for the corresponding block or net;

wherein the scheduler responds to a change in a net input value by scheduling a net update event if no wire delay value for the net is to be considered and by scheduling a net update event that in turn schedules a wire delay sink value update event for that net only if a wire delay value for the net is to be considered.

7. A method of providing a computer simulation of a logic circuit whose changes in logic signal input values are retrieved from a master queue of the computer, the method comprising the steps of:

maintaining a simulation time clock;

retrieving an update event defining a change in a logic signal input value from the master queue for each simulation time clock value during the computer simulation and performing update processing in accordance with the retrieved update event;

placing a compute event on the master queue for every update event retrieved from the master queue in accordance with the update event;

calling an update processor according to the update event;

repeating the steps of retrieving, placing, and calling for all update events at a current simulation clock time;

retrieving a compute event from the master queue for the current simulation clock time;

calling a compute processor in accordance with the retrieved compute event;

wherein the step of placing a compute event on the master queue comprises scheduling a wire delay sink value update event if the update event retrieved from the master queue comprises a "net update with wire delay" event.

8. A method as defined in claim 7, wherein the wire delay sink value update event is scheduled to occur at a simulation time clock value in the future that accounts for a wire delay time of the net.

9. A method as defined in claim 7, wherein the step of placing a compute event further includes placing a wire delay propagate compute event on the master queue that calculates a net output value and accounts for a wire delay time of the net.

10. A method as defined in claim 7, wherein the step of performing update processing in accordance with the retrieved update event comprises calling a processing routine that performs one of either a "single source, without wire delay" process that determines an output value for a net having a single source, without considering a wire delay value, a "multi-source, without wire delay" process that determines an output value for a net having multiple sources, without considering a wire delay value, a "single source, with wire delay" process that determines an output value for a net having a single source, and considers a wire delay value, a "multi-source, with wire delay" process that determines an output value for a net having multiple sources, and considers a wire delay value, or "a wire delay sink value" process that determines the output value of a net, taking into consideration a specified wire delay value for the net.

11. A method as defined in claim 10, wherein the "wire delay sink value" process comprises the steps of:

determining the output value of a net at a current simulation clock time by updating the input pin value of the logic circuit block connected to the net; and causing a compute event to be scheduled for the logic circuit block at the current simulation clock time.

12. A method as defined in claim 7, wherein the step of calling a compute processor in accordance with the retrieved compute event comprises calling a processing routine that performs either a "circuit component" process that determines the output value of a logic circuit component or a "wire delay propagate" process that determines the output value of a net and the simulation clock time at which the output value should appear at the sink end of the net.

13. A program storage device readable by a machine, tangibly embodying a program of instructions executable by the machine to perform method steps for providing a machine simulation of a logic circuit whose changes in logic signal input values are retrieved from a master queue of the machine, the method steps performed by the machine comprising:

maintaining a simulation time clock;

retrieving an update event defining a change in a logic signal input value from the master queue for each simulation time clock value during the computer simulation and performing update processing in accordance with the retrieved update event;

placing a compute event on the master queue for every update event retrieved from the master queue in accordance with the update event;

calling an update processor according to the update event;

repeating the steps of retrieving, placing, and calling for all update events at a current simulation clock time;

retrieving a compute event from the master queue for the current simulation clock time;

calling a compute processor in accordance with the retrieved compute event;

wherein the step of placing a compute event on the master queue comprises scheduling a wire delay sink value update event if the update event retrieved from the master queue comprises a "net update with wire delay" event.

14. A program storage device as defined in claim 13, wherein the wire delay sink value update event is scheduled by the machine to occur at a simulation time clock value in the future that accounts for a wire delay time of the net.

15. A program storage device as defined in claim 13, wherein the step of placing a compute event performed by the machine further inches placing a wire delay propagate compute event on the master queue that calculates a net output value and accounts for a wire delay time of the net.

16. A program storage device as defined in claim 13, wherein the step of performing update processing in accordance with the retrieved update event comprises calling a processing routine that performs one of either a "single source, without wire delay" process that determines an output value for a net having a single source, without considering a wire delay value, a "multi-source, without wire delay" process that determines an output value for a net having multiple sources, without considering a wire delay value, a "single source, with wire delay" process that determines an output value for a net having a single source, and considers a wire delay value, a "multi-source, with wire delay" process that determines an output value for a net having multiple sources, and considers a wire delay value, or "a wire delay sink value" process that determines the output value of a net, taking into consideration a specified wire delay value for the net.

17. A program storage device as defined in claim 16, wherein the "wire delay sink value" process comprises the steps of:

determining the output value of a net at a current simulation clock time by updating the input pin value of the logic circuit block connected to the net; and causing a compute event to be scheduled for the logic circuit block at the current simulation clock time.

18. A program storage device as defined in claim 13, wherein the step of calling a compute processor in accordance with the retrieved compute event comprises calling a processing routine that performs either a "circuit component" process that determines the output value of a logic circuit component or a "wire delay propagate" process that determines the output value of a net and the simulation clock time at which the output value should appear at the sink end of the net.

19. A program storage device as defined in claim 13, wherein the program of executable instructions comprise a data storage drive disk.

\* \* \* \* \*

UNITED STATES PATENT AND TRADEMARK OFFICE
CERTIFICATE OF CORRECTION

PATENT NO.   : 5,655,107
DATED        : August 5, 1997
INVENTOR(S)  : Bull

It is certified that error appears in the above-indentified patent and that said Letters Patent is hereby corrected as shown below:

On the title page,:
Item [56] References Cited

U.S. Patent Documents

ADD

| | | | |
|---|---|---|---|
| 5,493,508 | 02/1996 | Dangelo et al | 364/488 |
| 5,475,605 | 12/1995 | Lin | 364/488 |
| 5,222,030 | 06/1993 | Dangelo et al | 364/488 |
| 5,675,832 | 06/1987 | Robinson et al | 364/488 |

Signed and Sealed this

Sixth Day of July, 1999

Attest:

Q. TODD DICKINSON

*Attesting Officer*      *Acting Commissioner of Patents and Trademarks*